United States Patent
Chillara et al.

(10) Patent No.: US 10,931,290 B2
(45) Date of Patent: Feb. 23, 2021

(54) FAST SETTLING RAMP GENERATION USING PHASE-LOCKED LOOP

(71) Applicant: Analog Devices Global Unlimited Company, Hamilton (BM)

(72) Inventors: Vamshi Krishna Chillara, Raheen (IE); Declan M. Dalton, Ballyneety (IE); Pablo Cruz Dato, Valencia (ES)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 15/942,119

(22) Filed: Mar. 30, 2018

(65) Prior Publication Data

US 2019/0305785 A1 Oct. 3, 2019

(51) Int. Cl.
| | |
|---|---|
| *H03L 7/00* | (2006.01) |
| *H03L 7/197* | (2006.01) |
| *H03L 7/107* | (2006.01) |
| *H03L 7/095* | (2006.01) |
| *H03L 7/12* | (2006.01) |
| *H03L 7/113* | (2006.01) |

(52) U.S. Cl.
CPC .............. *H03L 7/197* (2013.01); *H03L 7/095* (2013.01); *H03L 7/107* (2013.01); *H03L 7/113* (2013.01); *H03L 7/12* (2013.01)

(58) Field of Classification Search
CPC . H03L 7/197; H03L 7/113; H03L 7/12; H03L 7/107; H03L 7/095
USPC .......................................................... 331/34
See application file for complete search history.

(56) References Cited

U.S. PATENT DOCUMENTS

| | | | |
|---|---|---|---|
| 4,757,279 A | 7/1988 | Balzano | |
| 6,429,693 B1 | 8/2002 | Staszewski et al. | |
| 7,369,002 B2 | 5/2008 | Spijker et al. | |
| 8,638,139 B2 | 1/2014 | Keaveney et al. | |
| 8,786,341 B1 | 7/2014 | Weltin-Wu et al. | |
| 8,901,974 B2 | 12/2014 | Sareen et al. | |
| 9,584,132 B2 | 2/2017 | Kim et al. | |
| 2005/0111605 A1 | 5/2005 | Loke et al. | |
| 2007/0024383 A1 | 2/2007 | Spijker et al. | |

(Continued)

FOREIGN PATENT DOCUMENTS

| | | |
|---|---|---|
| CN | 104956591 A | 9/2015 |
| CN | 105811924 A | 7/2016 |

(Continued)

OTHER PUBLICATIONS

Author: Wanghua Wu et al.; Title: A 56.4 to 63.4 GHz Multi-Rate All-Digital Fractional-N PLL for FMCW Radar Applications in 65 nm CMOS; Date: May 2014; Publisher: IEEE; vol. 49 No. 5; Pertinent pp. 1081-1096 (Year: 2014)*

(Continued)

*Primary Examiner* — Richard Tan
(74) *Attorney, Agent, or Firm* — Knobbe, Martens, Olson & Bear, LLP

(57) ABSTRACT

Aspects of this disclosure relate to reducing settling time of a ramp signal in a phase-locked loop. An offset signal can be applied to adjust an input signal provided to an integrator of a loop filter of the phase-locked loop to cause the settling time to be reduced. Disclosed methods of reducing settling time of a ramp signal can improve settling time of a ramp signal independent of the profile of the ramp signal.

20 Claims, 13 Drawing Sheets

(56) References Cited

U.S. PATENT DOCUMENTS

| | | | |
|---|---|---|---|
| 2007/0085622 A1* | 4/2007 | Wallberg | H03L 7/093 331/179 |
| 2007/0120586 A1 | 5/2007 | Tyulpanov | |
| 2011/0148530 A1 | 6/2011 | Geltinger et al. | |
| 2012/0319889 A1 | 12/2012 | Kobayashi et al. | |
| 2014/0085012 A1 | 3/2014 | Wu et al. | |
| 2015/0288371 A1 | 10/2015 | Prummel | |
| 2017/0012631 A1 | 1/2017 | Dato et al. | |
| 2018/0097522 A1 | 4/2018 | Chillara et al. | |

FOREIGN PATENT DOCUMENTS

| | | |
|---|---|---|
| EP | 1178609 | 6/2002 |
| EP | 2 237 418 | 10/2010 |
| JP | H05152947 A | 6/1993 |
| JP | 2002076886 A | 3/2002 |
| JP | 2011010138 | 1/2011 |
| JP | 2013-002949 | 1/2013 |
| JP | 2016063442 | 4/2016 |

OTHER PUBLICATIONS

Staszewski, et al., "All Digital PLL With Ultra Fast Settling," IEEE Transaction on Circuits and Systems—II: Express Briefs, vol. 54, No. 2, Feb. 2007.

Takinami, K., et al., "A Distributed Oscillator Based All-Digital PLL With a 32-Phase Embedded Phase-to-Digital Converter," IEEE Journal of Solid-State Circuits, vol. 46, No. 11, Nov. 2011, pp. 2650-2660.

Temporiti, et al., "A 3 GHz Fractional All-Digital PLL With a 1.8 MHz Bandwidth Implementing Spur Reduction Techniques," IEEE Journal of Solid-State Circuits, vol. 44, No. 3, Mar. 2009, pp. 824-834.

Texas Instruments, "LMX2492/LMX2492-Q1 14 GHz Low Noise Fractional N PLL with Ramp/Chirp Generation," revised May 2015, 42 pages, available at: http://www.ti.com/lit/ds/symlink/lmx2492-q1.pdf (accessed Jan. 11, 2017).

Thurm, K., et al., "A Novel Interlaced Chirp Sequence Radar Concept with Range-Doppler Processing for Automotive Applications," IEEE MMT-S International Microwave Symposium Digest, May 2015, 4 pages.

Velner, J., et al., "A Multi-Band, High Bandwidth, Short Duration Linear Chirp Generation IC for Phased-Array Applications," 2013 IEEE International Symposium on Phased Array Systems & Technology, Oct. 2013, 4 pages.

Wu, et al., "A mm-Wave FMCW Radar Transmitter Based on a Multirate ADPLL," 2013 IEEE Radio Frequency Integrated Circuits Symposium, Jun. 2013, pp. 107-110.

Wu, Wanghua, "Millimeter-Wave Digitally-Assisted Frequency Synthesizer in CMOS," Doctoral Thesis, Delft University of Technology, 2013.

Bengtsson, Lars E., "Implementation of high-resolution time-to-digital converter in 8-bit microcontrollers," Review of Scientific Instruments, vol. 83, Apr. 5, 2012.

Tsutsumi, Koji, Taniguchi, Eiji, "A Fast Chirp Generation PLL-IC using Polarity Switching Loop Filter", Proceedings of the 2016 IEICE General Conference Electronics 1, The Institute of Electronics, Information and Communication Engineers, Mar. 15, 2016, p. 54.

"A Concise Summary of the International System of Units, SI", Comité Consultatif des Unités (CCU) of the ComitéInternational des Poids et Mesures (CIPM), BIPM, 9$^{th}$ Edition, 2019, available at: https://www.bipm.org/utils/common/pdf/si-brochure/SI-Brochure-9-concise-EN.pdf.

Japanese Office Action dated Aug. 3, 2020 JP Application No. 2019-067337.

Tsutsumi, Koji. A Fast Chirp Generation PLL-IC using Polarity Switching Loop Filter, The Institute of Electronics Information and Communication Engineers, My 2016, pp. 47-50.

* cited by examiner

FAST SETTLING RAMP GENERATION USING PHASE-LOCKED LOOP

FIELD OF DISCLOSURE

The disclosed technology relates to phase-locked loops.

BACKGROUND

A ramp signal or ramp can refer to a frequency modulated (FM) signal. A ramp signal can be used in radar applications, for example, to determine an object's range and velocity. A ramp signal has a frequency that varies over a fixed period of time. When a desired frequency as a function of time takes on a sawtooth shape, it can be referred to as a sawtooth chirp. A sawtooth chirp may be generated using a ramp generator and/or in a phase-locked loop. Another type of ramp signal that can be generated in a phase-locked loop is a triangle ramp signal.

Phase-locked loops (PLLs) are closed loop systems for locking the phase of a reference signal with an oscillator. Settling time for a ramp signal can be a significant performance parameter in a PLL arranged to generate a ramp signal.

SUMMARY OF THE DISCLOSURE

The innovations described in the claims each have several aspects, no single one of which is solely responsible for the desirable attributes. Without limiting the scope of the claims, some prominent features of this disclosure will now be briefly described.

One aspect of this disclosure is a phase-locked loop with fast settling ramp generation. The phase-locked loop comprises a phase detector comprising an output and a loop filter. The loop filter comprises an integrator and an input coupled to the output of the phase detector. The loop filter is configured to provide a ramp signal. The phase-locked loop is configured to apply an offset signal to adjust an input signal provided to the integrator to cause settling time of the ramp signal to be reduced.

The phase-locked loop can include an oscillator comprising an input coupled to an output of the loop filter. The phase phase-locked loop can include a phase error circuit configured to compute the offset based on a change in slope of the ramp signal and an indication of gain of the oscillator. The phase-locked loop can include an oscillator gain estimation circuit configured to provide the indication of gain of the oscillator to the phase error circuit. The oscillator gain estimation circuit can include a correction loop configured to generate the indication of gain of the oscillator based on an output signal at the output of the phase detector. The oscillator gain estimation circuit can compute the indication of gain of the oscillator based on measurements of a parameter of the phase-locked loop changing in response to changing a signal applied to the phase-locked loop.

The phase-locked loop can apply the offset signal between the output of the phase detector and an input of the integrator. The phase-locked loop can include an adjustment circuit comprising an input configured to receive the offset signal and an output electrically connected to the integrator. The phase-locked loop can be a type II phase-locked loop. The phase-locked loop can include a digitally controlled oscillator, in which the ramp signal represents an oscillator tuning word for the digitally controlled oscillator. The phase-locked loop can include a time-to-digital converter coupled in a feedback path between an output of the digitally controlled oscillator and an input of the phase detector. The ramp signal can have a settling time of less than 1 microsecond. The offset signal can have a value to cause an output signal of the phase detector provided to the digital loop filter to remain at approximately zero while the loop filter generates the ramp signal.

Another aspect of this disclosure is a method of generating a ramp signal with a fast settling time in a phase-locked loop. The method includes applying an offset signal to adjust an input signal provided to an integrator of a loop filter of the phase-locked loop. The method further includes generating a ramp signal at an output of the loop filter of a phase-locked loop, in which the applying the offset signal causes settling time of the ramp signal to be reduced.

The method can include computing an indication of gain of an oscillator of the phase-locked loop and generating the offset signal based on the indication of gain of the oscillator of the phase-locked loop. The method can include generating an oscillating signal with a digitally controlled oscillator of the phase-locked loop, in which the ramp signal represents an oscillator tuning word for the digitally controlled oscillator. The method can include providing feedback from the digitally controlled oscillator to the phase detector by way of feedback path that comprises a time-to-digital converter. The ramp signal can have at least two different slopes in any of these methods.

Another aspect of this disclosure is a phase-locked loop with fast settling ramp generation. The phase-locked loop includes a phase detector comprising an output, a loop filter comprising an input coupled to the output of the phase detector, and an oscillator coupled to the loop filter. The loop filter is configured to generate a ramp signal such that the ramp signal has a settling time of less than 2 microseconds. The ramp signal has at least two different slopes. The oscillator is configured to generate an oscillating signal based on the ramp signal.

The loop filter can include an integrator. The phase-locked loop can apply an offset signal to adjust an input signal provided to the integrator to cause settling time of the ramp signal to be reduced. The phase-locked loop can include a time-to-digital converter coupled in a feedback path between an output of the oscillator and an input of the phase detector. The phase-locked loop can be configured such that an output signal of the phase detector provided to the digital loop filter remains at approximately zero while the loop filter generates the ramp signal.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments and are not intended to be limiting.

DETAILED DESCRIPTION

Figure 1:
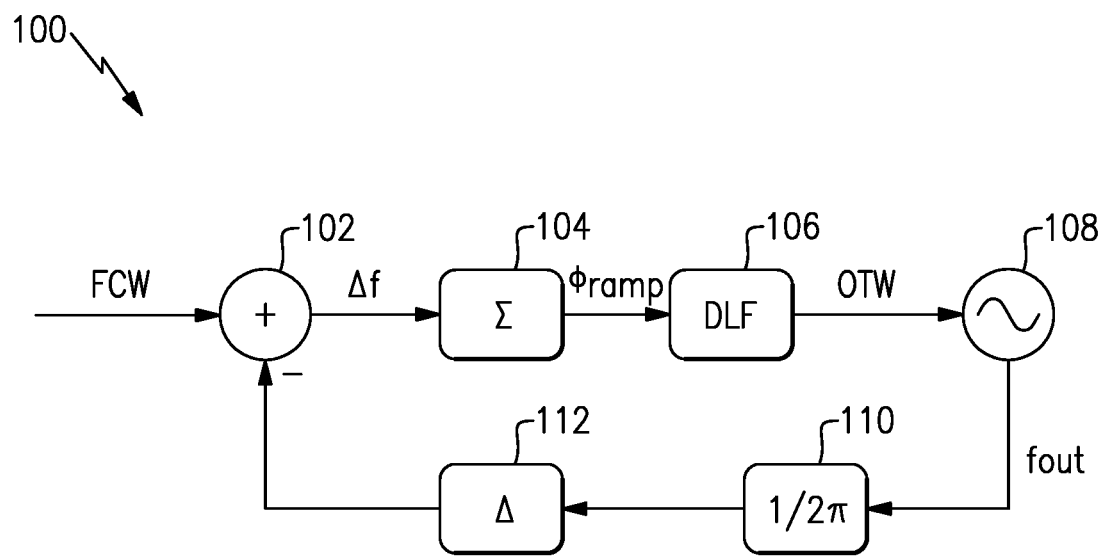
FIG. 1 is a system diagram of a digital phase-locked loop (DPLL) that includes a digital loop filter (DLF) according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A PLL can be designed to have a specific type (e.g., type-I, type-II, or higher) and a specific order (e.g., $1^{st}$ order, $2^{nd}$ order, or higher). In system theory, the type can refer to the number of integrators within the loop and the order can refer to the degree of the denominator in the PLL system transfer function. The order and/or the type can impact functionality of a PLL suitable for reliably generating ramps.

A digital phase-locked loop (DPLL) can be an attractive alternative to traditional charge-pump phase-locked loops (CP-PLLs) for frequency synthesis in advanced complementary metal oxide semiconductor (CMOS) technologies. While CP-PLLs are still widely used, DPLLs offer advantages more easily realized in the digital domain. These advantages can include enhanced performance and/or speed. DPLLs can also be implemented with a reduction in size and/or cost relative to CP-PLLs. For instance, a CP-PLL typically uses a voltage-controlled oscillator, which can be sensitive to temperature and/or to power supply variations, while a DPLL can be designed to be substantially immune to its environment and/or power supply.

A DPLL can be used to generate frequency ramps by providing an input frequency command word (FCW) that ramps in time. Example frequency ramps that can be generated using a DPLL include sawtooth ramps, triangular ramps, and other ramps having two or more slopes in a sequence of chirps, and with delays between chirps.

A ramp signal, which can also be referred to as a chirp, can have a frequency that ramps linearly in time and is periodic. An example sawtooth ramp will be discussed with reference to FIG. 2A. The sawtooth ramp includes a ramping section, in which the signal's frequency ramps linearly with time to its maximum frequency. The sawtooth ramp also includes a fast transition section, in which the waveform rapidly resets from its maximum frequency to its minimum or initial frequency. The bandwidth of a sawtooth ramp signal can be defined as the range of frequencies between the minimum and maximum frequency. During rapid transitions from maximum to minimum frequency, there can be a frequency overshoot and/or undershoot due to the properties of the DPLL. For instance, the type and/or order of the DPLL can determine the loop response time. The loop response time, in turn, can affect how long it takes to establish lock to the correct frequency value with little or no frequency error. Thus, the settling time and frequency error can be significant performance criteria. Accordingly, there is a need to develop a DPLL which can generate sawtooth ramps with fast settling times.

A triangle ramp is a signal having a frequency that ramps linearly in time, can be periodic, and has a slope that changes sign at a maximum frequency and a minimum frequency. An example triangle ramp will be discussed with reference to FIG. 2B. The triangle ramp can include a positive ramping section, in which the signal's frequency ramps linearly with time from its minimum frequency to its maximum frequency. The triangle ramp can also include a negative ramping section, in which the signal's frequency ramps linearly with time from its maximum frequency to its minimum frequency. The bandwidth of a triangle ramp signal can be defined as the range of frequencies between the minimum frequency and the maximum frequency. During transitions in sign at a maximum frequency and at a minimum frequency, there can be a frequency overshoot and/or undershoot due to properties of the DPLL. For instance, the type and/or order of the DPLL can determine the loop response time. The loop response time can, in turn, affect how long it takes to establish a lock to the correct frequency value with little or no frequency error. Thus, the settling time and frequency error can be significant performance criteria. Accordingly, there is a need to develop a DPLL which can generate triangle ramps with fast settling times.

Aspects of this disclosure relate to apparatus and methods for fast settling ramp generation in digital phase-locked loops. Methods to reduce the settling time of the frequency ramps generated by a digital phase-locked loop (DPLL) are described. Disclosed methods involve predicting a phase error that a DPLL acquires for a given ramp profile and applying an offset signal to adjust an input signal provided to an integrator of a digital loop filter of the DPLL. The offset signal can be applied in a signal path between an output of a phase detector and the input of the integrator of the digital loop filter. For instance, an offset signal representing a predicted phase error can be added using an adder having an output electrically connected to an input of an integrator of the digital loop filter of the DPLL. The offset signal can be any suitable substantially constant value that incorporates the predicted phase error. In some instances, the offset signal can include a scaled predicted phase error. The offset signal can be applied to adjust the input signal provided to the integrator at or near the start of a chirp.

In an embodiment, an oscillator tuning word (OTW) can be generated from an output of the phase detector based on a proportional path of the digital loop filter and an integral path of the digital loop filter of a type-II DPLL. To reduce settling time of a frequency ramp, the predicted phase error can be calculated and added to an input of an integrator of the integral path close in time to the start of a chirp.

DPLLs can enable accurate estimation of the phase error that can result in a frequency ramp with a fast settling time. For instance, a predicted phase error for a given chirp profile can involve obtaining a product of the deviation of the frequency command word (FCW) on each ramp step ΔFCW and an oscillator gain normalization factor β. By applying the estimation of phase error in the signal path from an output of the phase detector to an input of an integrated in a digital loop filter, settling time of a frequency ramp signal can be reduced relative to waiting for the DPLL to lock to the desired phase error for the digital loop filter to have an accurate phase error value.

To estimate a predicted phase error accurately, a gain kv of the oscillator of the DPLL can be determined accurately over a frequency range of a chirp. Methods of determining an indicator of oscillator gain kv are disclosed. Example indicators of oscillator gain include the oscillator gain kv and an oscillator gain normalization factor β.

One method of determining oscillator gain kv includes a bow calibration routine that measures an indication of the oscillator gain kv around two frequencies of a chirp, such as a minimum frequency and a maximum frequency, and interpolates the gain linearly for intermediate frequencies. The method can adjust the estimated oscillator gain by measuring the oscillator gain at either or both ends of the generated ramp frequency before the ramp generation starts and linearly interpolating the oscillator gain for the frequencies in between. In an embodiment, a DPLL can be configured to lock to two relatively close frequencies at either or both ends of the generated ramp frequency and measure the corresponding change in the OTW to determine the gain normalization factor β at either or both ends of the ramp, in which the gain normalization factor β is an indication of the oscillator gain kv. The gain normalization factor β can be determined for frequencies between the ends of the ramp by linear interpolation.

Another method of determining oscillator gain kv includes running a background calibration routine that uses the output of the phase detector during ramp generation to estimate the oscillator gain kv. A method of adjusting an oscillator gain normalization factor β can be run in the background while the DPLL is operating. The method can include using a deviation of the phase error (e.g., a phase detector output) from zero while generating ramps with a DPLL. This phase error deviation can be used to generate the correction term for an initial estimate of the oscillator gain normalization factor 3. Such a method can correspondingly adjust a predicted phase error that is determined based on the indication of oscillator gain. In an embodiment, a DPLL can multiply a predicted phase error by a constant that is less than 1 (or alternatively using an output of a proportional of a digital loop filter that generates the OTW), and adding the result to the initial estimate of the oscillator gain normalization factor β for a positive ramp or subtracting it from the initial oscillator gain normalization factor β for a negative ramp. The resulting oscillator gain normalization factor β can converge on a value that corresponds to the average value of the actual gain of the oscillator over the frequency range of the generated ramp.

Methods and apparatus disclosed herein can advantageously generate fast settling ramps for various ramp profiles, such as sawtooth ramps or triangle ramps. The various ramp profiles can have various slopes and/or bandwidths and/or start frequencies. Methods disclosed herein can provide fast settling ramps at relatively large bandwidths.

FIG. 1 is a schematic block diagram of a digital phase-locked loop (DPLL) 100 according to an embodiment. The illustrated DPLL includes a summer 102, an accumulator 104, a digital loop filter (DLF) 106, a digitally controlled oscillator (DCO) 108, a time-to-digital converter (TDC)/counter 110, and a differentiation block 112. The DLF 106 apply an indication of predicted phase error to reduce a settling time for a frequency ramp provided as the oscillator tuning word OTW to the DCO 108.

A frequency command word FCW is provided at an input of the summer 102. The frequency command word FCW provides digital data that the DPLL 100 uses to generate an output signal having an output frequency $f_{out}$.

The DPLL 100 can be a type-II DPLL that includes a TDC/counter 110. The TDC/counter 110 can convert the output phase in radians to a decimal number normalized to the DCO 108 clock period. Accordingly, the illustrated TDC/counter 110 is labeled as $\frac{1}{2\pi}$ to represent such a transfer function. This output normalized phase is then differentiated in digital domain by the differentiation block 112 to generate the digitized output frequency for a phase detector. As illustrated in FIG. 1, the phase detector can be implemented by the summer 102 and the accumulator 104.

The TDC/counter 110 and differentiation block 112 can represent and model the system-level return path in the DPLL 100. An output of the differentiation block 112 is provided to the summer 102. The summer 102 can subtract the output of the differentiation block 112 from the frequency command word FCW in the digital domain to provide a difference Δf. The difference Δf can be applied to the accumulator 104. In the DPLL 100 of FIG. 1, the summer 102 and the accumulator 104 are a phase detector realized in the digital domain.

In FIG. 1, the output of accumulator 104 represents a phase error $\Phi_{ramp}$. When the DPLL 100 is in the process of generating a ramp signal, the phase error can have a non-zero value that can be constant. The phase error $\Phi_{ramp}$ of FIG. 1 can represent the phase error while the DPLL 100 is generating a ramp signal in the frequency domain as a function of time. The phase error $\Phi_{ramp}$ can be represented by a digital word in the DPLL 100.

The phase error $\Phi_{ramp}$ is provided to an input of the DLF 106. The DLF 106 performs digital filtering operations to provide an oscillator tuning word OTW. The oscillator tuning word OTW is provided to an input of the DCO 108, which, in turn, provides the output signal having output frequency $f_{out}$. The DLF 106 can be programmable. A goal of the DPLL is to lock the output frequency $f_{out}$ to the frequency command word FCW so that a frequency error Δf reduces to zero or almost zero.

As shown in FIG. 1, an input of the DPLL 100 receives the frequency command word FCW. The frequency command word FCW is an input to the DPLL 100 from which an output clock signal of the DPLL 100 is generated. The output of the differentiation block 112 can be subtracted from the frequency command word FCW to provide the frequency error Δf, which is integrated to generate the phase error $\Phi_{ramp}$. The phase error $\Phi_{ramp}$, after being filtered by the digital loop filter DLF 106, controls the DCO 108 to generate the desired output frequency $f_{out}$. An expression for the output frequency $f_{out}$ can be given by Equation 1 in terms of a reference clock frequency $f_{ref}$.

$$f_{out} = FCW \cdot f_{ref} \qquad \text{Equation 1}$$

When the frequency command word FCW is a digital representation of a signal having sharp or rapid transitions, there can be a transient recovery time due to system response time. Features of the DLF 106 discussed herein can compensate for inaccuracies of the OTW following a rapid transition in the frequency command word FCW.

Figure 2A:
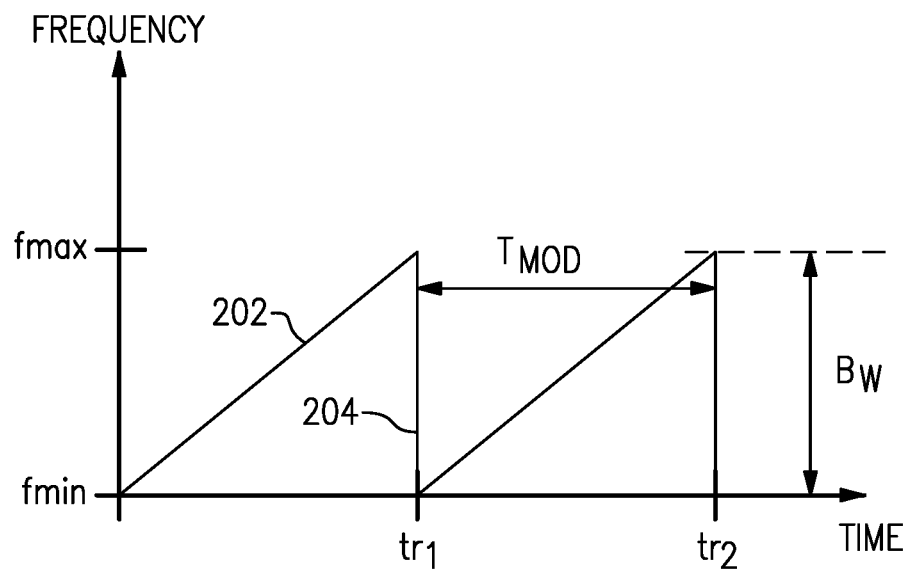
FIG. 2A illustrates a plot of a frequency versus time of an example sawtooth ramp that can be generated by the DPLL of FIG. 1.

FIG. 2A illustrates a plot of frequency versus time of an example sawtooth ramp that can be generated by the DPLL 100. As shown in FIG. 2A, the sawtooth ramp is periodic with a period $T_{MOD}$. Each sawtooth ramp has a ramping portion 202 and a sharp transition portion 204. The ramping portion 202 of the sawtooth ramp can be determined by a periodic piecewise linear relationship for a time between 0 and $t_{r1}$.

The sharp transition portion 204 represents a part of the sawtooth ramp where the sawtooth is reset from its maximum frequency $f_{max}$ to its minimum frequency $f_{min}$. The sharp transition 204 is shown to occur at times $t_{r1}$ and $tr_2$ that are separated in time by the period $T_{MOD}$. As shown in FIG. 2A, the signal bandwidth BW is the difference of the maximum frequency $f_{max}$ and the minimum frequency $f_{min}$. At the times $t_{r1}$ and $t_{r2}$ where the sawtooth ramp is reset, a large frequency error Δf can occur while a DPLL is in a transient state.

This transient duration can be a significant portion of a chirp duration while generating fast ramps that are used in range Doppler analysis. As taught herein, a DPLL 100 including a DLF 106 that reduces transient errors can improve the settling time. Further, the teachings herein can apply to other chirp waveforms, including chirp waveforms that include a fast transition portion similar to the fast transition portion 204 of FIG. 2A. While FIG. 2A shows a sawtooth ramp signal that has a ramp that increases in frequency, any suitable principles and advantages discussed herein can be applied to sawtooth ramp signals that decrease in frequency and then has a sharp transition. Although FIG. 2A shows a plot of an example sawtooth ramp, the teachings herein can be applied to the generation of other periodic frequency signals or waveforms where there is a ramping portion, such as the ramping portion 202, but where the ramping portion increases or decreases linearly over a known bandwidth BW.

Figure 2B:
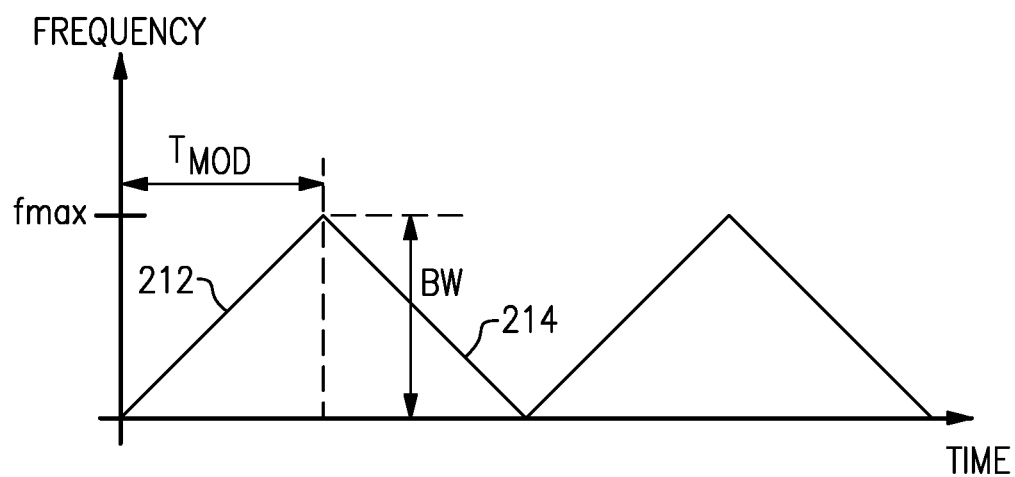
FIG. 2B illustrates a plot of a frequency versus time of an example triangular ramp that can be generated by the DPLL of FIG. 1.

FIG. 2B illustrates a plot of frequency versus time of an example triangular ramp that can be generated by the DPLL 100. As shown in FIG. 2B, the triangular ramp is periodic having a time $T_{MOD}$ for which the triangular ramp has a positive or negative slope. Each period of the triangular ramp includes a positive ramping portion 212 and a negative ramping portion 214. These ramping portions can be represented by a periodic piecewise linear functions.

A relatively large frequency error can occur turning a transient state while the DPLL locks to the input ramp where the triangular ramp changes sign (e.g., from negative to positive or from positive to negative). This transient duration can be a significant portion of the chirp duration while generating fast ramps that are used, for example, in range Doppler analysis. As one example, the settling time can be approximately 4 to 5 microseconds in which a chirp is around 10 microseconds in certain instances in which a DPLL does not include compensation to reduce settling time. Accordingly, the settling time can take up about 40% to 50% of period of the ramp in such instances. As disclosed herein, a DPLL 100 including a DLF 106 that reduces transient errors can improve the settling time.

The principles and advantages discussed herein can be applied to generation of any suitable ramp, which can include ramp signals with different waveforms than shown in FIG. 2A or FIG. 2B. Such ramp signals can have two or more different slopes in a sequence of chirps and the settling time can be reduced for transitions between the different slopes in accordance with any suitable principles and advantages discussed herein. A phase error $\Phi_{ramp}$ should have a different value for each of the different slopes.

Figure 3:
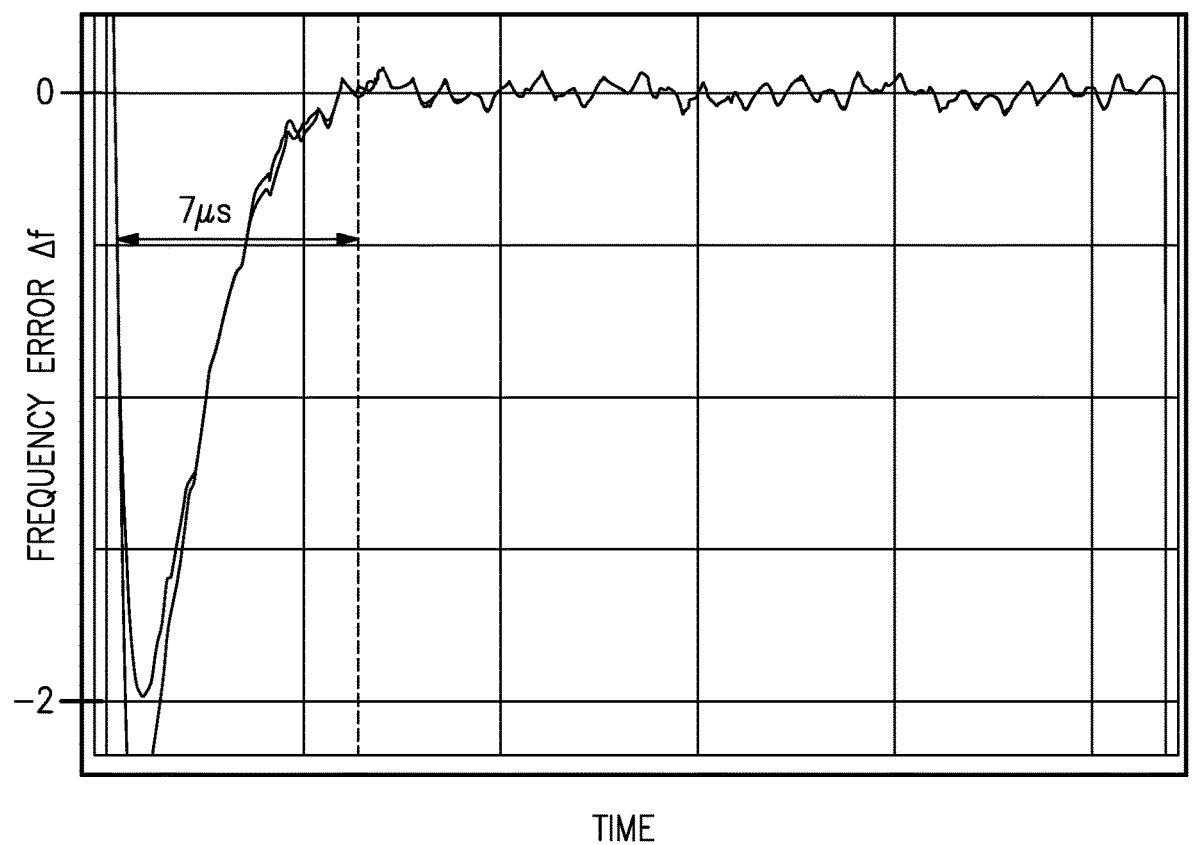
FIG. 3 shows a plot of frequency error as a function of time for measured sawtooth ramps having settling time errors.

FIG. 3 shows a plot of frequency error Δf as a function of time for two curves corresponding to measured sawtooth ramps having relatively large settling time errors. As shown in FIG. 3, the settling time errors can be approximately 7 microseconds in duration in certain instances in which a DPLL does not include compensation to reduce settling time. A relatively long settling time can limit the useful duration of the generated ramp.

A PLL is prone to the settling time errors illustrated in FIG. 3 when it is configured in type-II mode, a mode commonly used for generating ramps. When a type-II PLL is locked to a single frequency, its phase error can approach a steady state value around zero. On the other hand, when locking to a sawtooth ramp or similar frequency ramping signal, the phase error $\Phi_{ramp}$ can reach a constant non-zero steady-state value that is a function of several parameters including the slope of the generated ramp and loop filter coefficients. For instance, the phase error $\Phi_{ramp}$ can be a function of a ramp slope A Hz/s and an integral coefficient ρ of a proportional-integral (PI) filter of the loop filter. Thus, the steepness and/or slope of the ramp, as well as the DPLL type (e.g. type-II) and properties of the loop filter, can be factors in determining how the DPLL locks to a steady-state value of the phase error $\Phi_{ramp}$. The phase error $\Phi_{ramp}$ can be represented by Equation 2, in which A is a ramp slope in Hz/s, ρ is an integral coefficient of a PI filter of the DLF, $f_{REF}$ is a reference frequency received by the DPLL, kv is an oscillator gain, and $\hat{k}_v$ is an estimated oscillator gain.

$$\phi_{ramp} = \frac{A}{\rho \cdot f_{REF}^2} \cdot \frac{\hat{k}_v}{k_v} \qquad \text{Equation 2}$$

The relatively large settling time observed in FIG. 3 can be the result of a DPLL trying to acquire a steady state phase error $\Phi_{ramp}$ starting from an initial value of zero. As indicated by Equation 2, phase error $\Phi_{ramp}$ can be a function of ramp slope A, reference frequency $f_{REF}$, and integral coefficient ρ provided that the oscillator gain is estimated accurately. This suggests that by estimating the phase error and adding the predicted phase error to the integrator in the PI filter, the settling time could be greatly reduced.

Figure 4A:
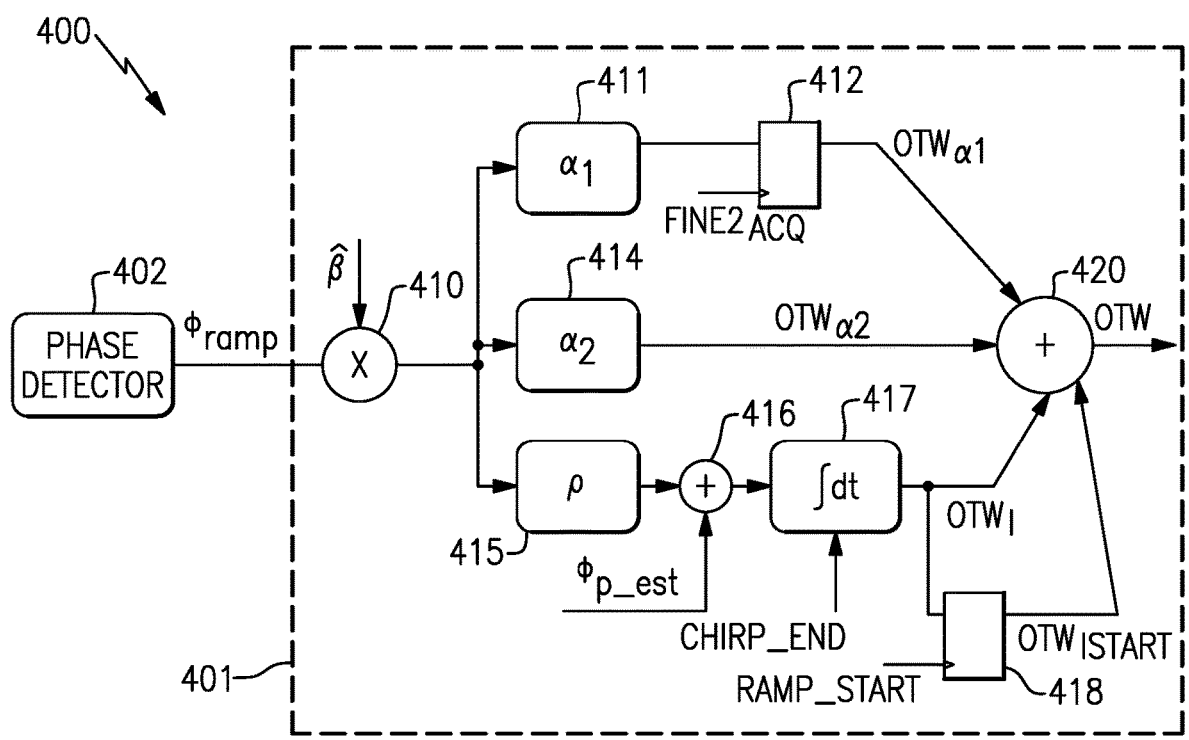
FIG. 4A shows a schematic block diagram of a portion of a DPLL that includes a DLF according to an embodiment.

FIG. 4A shows a schematic block diagram of a portion 400 of a DPLL that includes a DLF 401 according to an embodiment. The DLF 401 is an example of the DLF 106 of FIG. 1. Accordingly, the DLF 401 can be implemented in the DPLL 100 of FIG. 1, for example. The illustrated DLF 401 receives the phase error $\Phi_{ramp}$ from a phase detector 402 and generates the oscillator tuning word OTW for a DCO, such as the DCO 108 of FIG. 1. The illustrated DLF 401 includes a scaling circuit 410; a first proportional path that includes a first proportional block 411 and a digital memory element 412; a second proportional path that includes a second proportional block 414; an integral path that includes an integral coefficient block 415, an adjustment circuit 416, an integrator 417, and digital memory element 418; and a combining circuit 420.

The scaling circuit 410 is configured to scale the phase error $\Phi_{ramp}$ by an oscillator gain normalization factor β. This can reduce and/or eliminate an influence of oscillator gain kv on a transfer function of the DPLL. The oscillator gain normalization factor β is an indication of oscillator gain.

As illustrated, the first proportional path of the DLF 401 is configured to receive a scaled output of the phase detector 402. The first proportional path can be active only during an acquisition period and its output $OTW_{\alpha_1}$ can be frozen once the DPLL is locked. The first proportional block 411 and the digital memory element 412 are connected between the phase detector 402 and the combining circuit 420 to operate as a proportional filter path with proportional coefficient $\alpha_1$. As shown in FIG. 4A, the proportional block 411 receives a scaled the phase error and multiplies it by the proportional coefficient $\alpha_1$. The digital memory element 412 is controlled by a control signal $fine2_{acq}$ to provide a first output $OTW_{\alpha_1}$ to the combining circuit 420. The digital memory element 412 can be a bank of flip-flops. The digital memory element 412 can sample an output of the first proportional block 411 based on the control signal $fine2_{acq}$. In certain embodiments, a DLF in accordance with any suitable principles and advantages discussed herein can be implemented without the proportional block 411 and the digital memory element 412.

As shown in FIG. 4A, the second proportional path of the DLF 401 is configured to receive a scaled output of the phase detector 402. As illustrated, the second proportional block 414 is connected between the phase detector 402 and the combining circuit 420 to operate as a proportional filter path with proportional coefficient $\alpha_2$. The second proportional block 414 receives the scaled phase error and multiplies it by the proportional coefficient $\alpha_2$ to generate a second output $OTW_{\alpha_2}$. The second output $OTW_{\alpha_2}$ is provided by the second proportion block 414 to the combining circuit 420.

The integral path of the DLF 401 can receive a predicted phase error $\Phi_{p\_est}$ and a scaled output of the phase detector 402. The integral coefficient block 415 and the integrator 417 are connected between the phase detector 402 and the combining circuit 420 to operate as an integral filter path with integral coefficient ρ. As shown in FIG. 4A, the scaled phase error is received by the integral coefficient block 415 and multiplied by the integral coefficient ρ.

The illustrated integral path also includes an adjustment circuit 416 in a signal path between the integral coefficient block 415 and the integrator 417. The adjustment circuit 416 can adjust an output provided by the integral block 415 based on the predicted phase error $\Phi_{p\_est}$. For example, the adjustment circuit 416 can be an adder configured to add the predicted phase error $\Phi_{p\_est}$ to the output provided by the integral block 415. The predicted phase error $\Phi_{p\_est}$ is an offset signal that causes settling time of a ramp generated by the DPLL to be reduced. The predicted phase error $\Phi_{p\_est}$ can be applied to the adjustment circuit at or near a start of a chirp. For instance, the predicted phase error $\Phi_{p\_est}$ can be applied in response to a chirp start signal being asserted.

The output of the adjustment circuit 416 is integrated by the integrator 417 to generate the integrated output $OTW_I$. The integrator 417 can be referred to as an accumulator. The integrator 417 can perform an integration function or any equivalent function. The integrator 417 can be reset at the start of a ramp burst. The reset can be in response to a chirp end signal chirp_end. The integrated output $OTW_I$ is provided to the combining circuit 420. The integrated output $OTW_I$ can be sampled using the digital memory element 418 at or around the start of a chirp. This sampling can be responsive to a ramp start signal ramp_start. The digital memory element 418 can provide an initial integrated output $OTW_{Istart}$ to the combing circuit 420. The digital memory element 418 can be a flip-flop or any other suitable digital memory element.

The combining circuit 420 can receive output signals from the first proportional path, the second proportional path, and the integral path. The combining circuit 420 can combine these signals to generate an oscillator tuning word (OTW) for a digitally controlled oscillator. For example, the combining circuit 420 can add the illustrated signals. The combining circuit 420 can perform any suitable operation to combine the outputs of the various paths of the DLF 401, such as addition and/or subtraction.

Once a DPLL acquires lock, the first output $OTW_{\alpha_1}$ can be held fixed by the digital memory element 412 and the second proportional path and the integral path can function as a proportional-integral (PI) filter to filter the phase error $\Phi_{ramp}$. Ignoring the predicted phase error $\Phi_{p\_est}$, during this mode of operation, a portion of the oscillator tuning word OTW generated by the DLF 401 at the output of the combing circuit 420 can be represented by Equation 3, in which β is a normalization factor to reduce and/or eliminate the influence of the oscillator gain kv on the loop transfer function. The normalization factor β̂ can be represented by Equation 4.

$$OTW = OTW_{\alpha_1} + \alpha_2 \phi \hat{\beta} + \rho \beta \int \phi DT \qquad \text{Equation 3}$$

$$\hat{\beta} = \frac{f_{REF}}{\hat{k}_v} \qquad \text{Equation 4}$$

When locked to a single frequency, the phase error $\Phi_{ramp}$ output by the phase detector 402 can drift around 0. Accordingly, the output tuning word OTW at the start of a chirp can be represented by Equation 5.

$$OTW_{start} = OTW_{\alpha 1} + OTW_{start} \qquad \text{Equation 5}$$

While the DPLL frequency is ramping, the output of the phase detector 402 can provide a phase error $\Phi_{ramp}$ having a substantially constant, non-zero value. This non-zero phase error $\Phi_{ramp}$ (or a processed/scaled version thereof) at the input of the PI filter of the DLF 401 can result in the ramp at the output of the DLF 401. Integration of a constant results in ramp. The phase error at the input of the integrator 417 of FIG. 4A when the DPLL is ramping can be represented by Equation 6.

$$\phi_{rampI} = \Delta_{ramp} \cdot \rho \cdot \hat{\beta} \qquad \text{Equation 6}$$

Using Equation 2, the phase error at the input of the integrator 417 can be simplified as shown in Equation 7.

$$\phi_{rampI} = \frac{A}{k_v f_{REF}} \qquad \text{Equation 7}$$

The slope of the ramp being generated can be expressed as a function of the number of steps nsteps in each chirp and the deviation in the FCW on each step ΔFCW and can be represented by Equation 8.

$$A = \left( \frac{\Delta FCW \cdot nsteps \cdot f_{REF}}{nsteps \cdot \left(\frac{1}{t_{REF}}\right)} \right) = \Delta FCW \cdot f_{REF}^2 \quad \text{Equation 8}$$

Using Equation 8 in Equation 7, the phase error at the input of the integrator 417 of FIG. 4A can be simplified to Equation 9.

$$\phi_{rampI} = \Delta FCW * \beta \quad \text{Equation 9}$$

Both parameters on the right-hand side of Equation 9 can be known beforehand, provided that the oscillator gain is estimated correctly. Thus, the input of the integrator 417 of the PI filter when the DPLL is generating ramps can be estimated and added as an offset $\Phi_{p\_est}$. The offset $\Phi_{p\_est}$ is an indication of predicted phase error. This offset added to the integrator 417 can then generate the ramp such that the output of the phase detector 402 stays at approximately zero, provided that the estimated oscillator gain is accurate. In this case, the output tuning word OTW when ramping can be represented by Equation 10.

$$OTW_{ramp} = OTW_{start} + \phi_{pest} t \quad \text{Equation 10}$$

At the end of a sawtooth chirp, the frequency should snap back to the starting value. To accomplish this, the integrator 417 in the PI filter can be reset at the end of each sawtooth chirp. Consequently, the output tuning word OTW and hence the DPLL frequency can return to the start value (see Equation 3) substantially instantaneously. This can significantly improve the settling time of the ramps that are generated.

Referring to FIG. 4A, the DLF 401 incorporates features for fast settling ramp generation. The adjustment circuit 416 can add an offset $\Phi_{p\_est}$ to an output of the integral coefficient block 415 and provide the adjusted output of the integral coefficient block 415 to an input of the integral 417. The offset $\Phi_{p\_est}$ can be updated depending on the slope of the ramp. The integrator 417 can be reset at the end of a sawtooth chirp. This can generate fast settling ramps even if ramp profile changes from one chirp to the next.

Figure 4B:
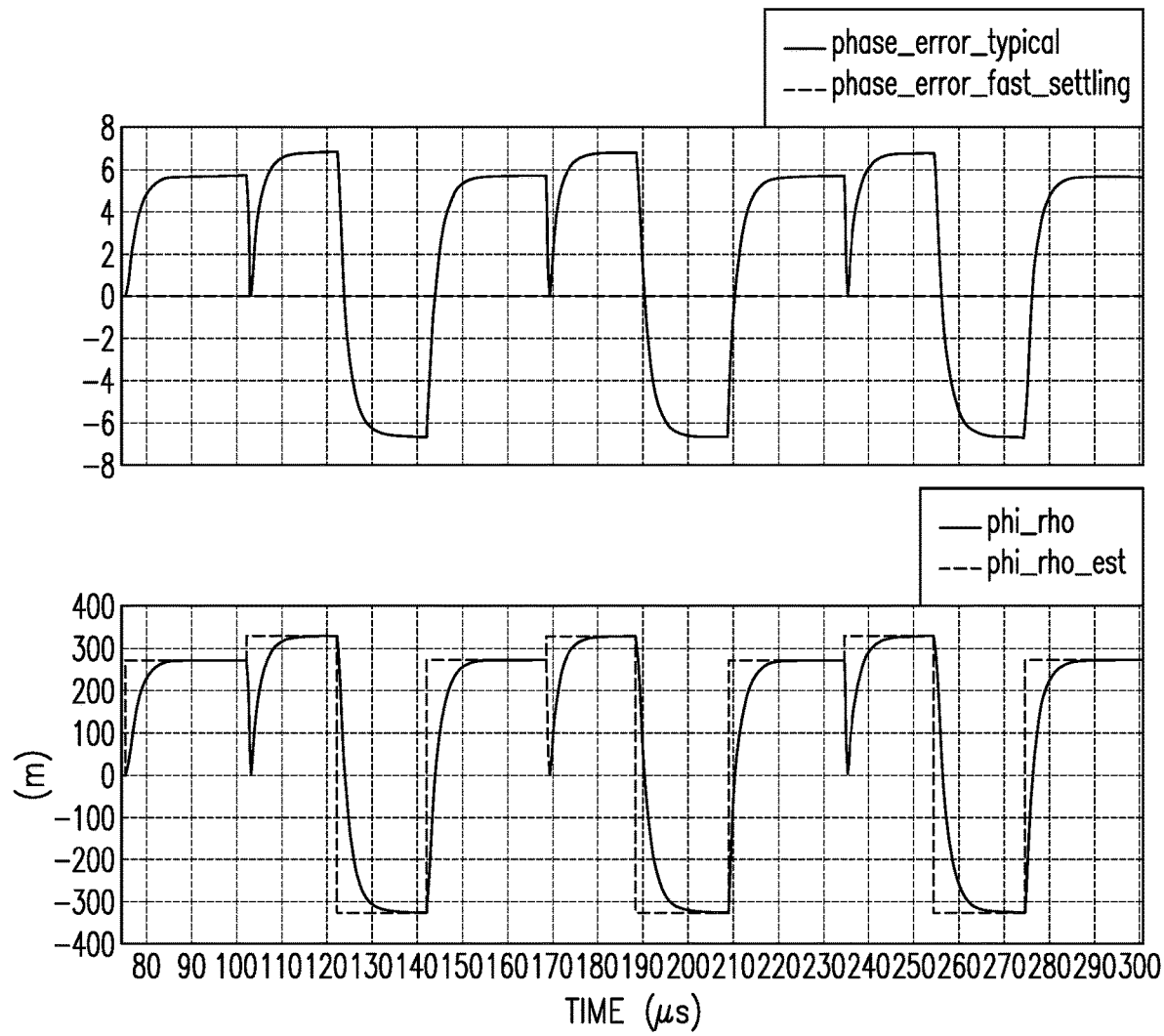
FIG. 4B shows simulated plots of internal phased locked loop signals of a DPLL that includes the DLF of FIG. 4A compared to a similar DPLL without a phase adjustment circuit.
Figure 4C:
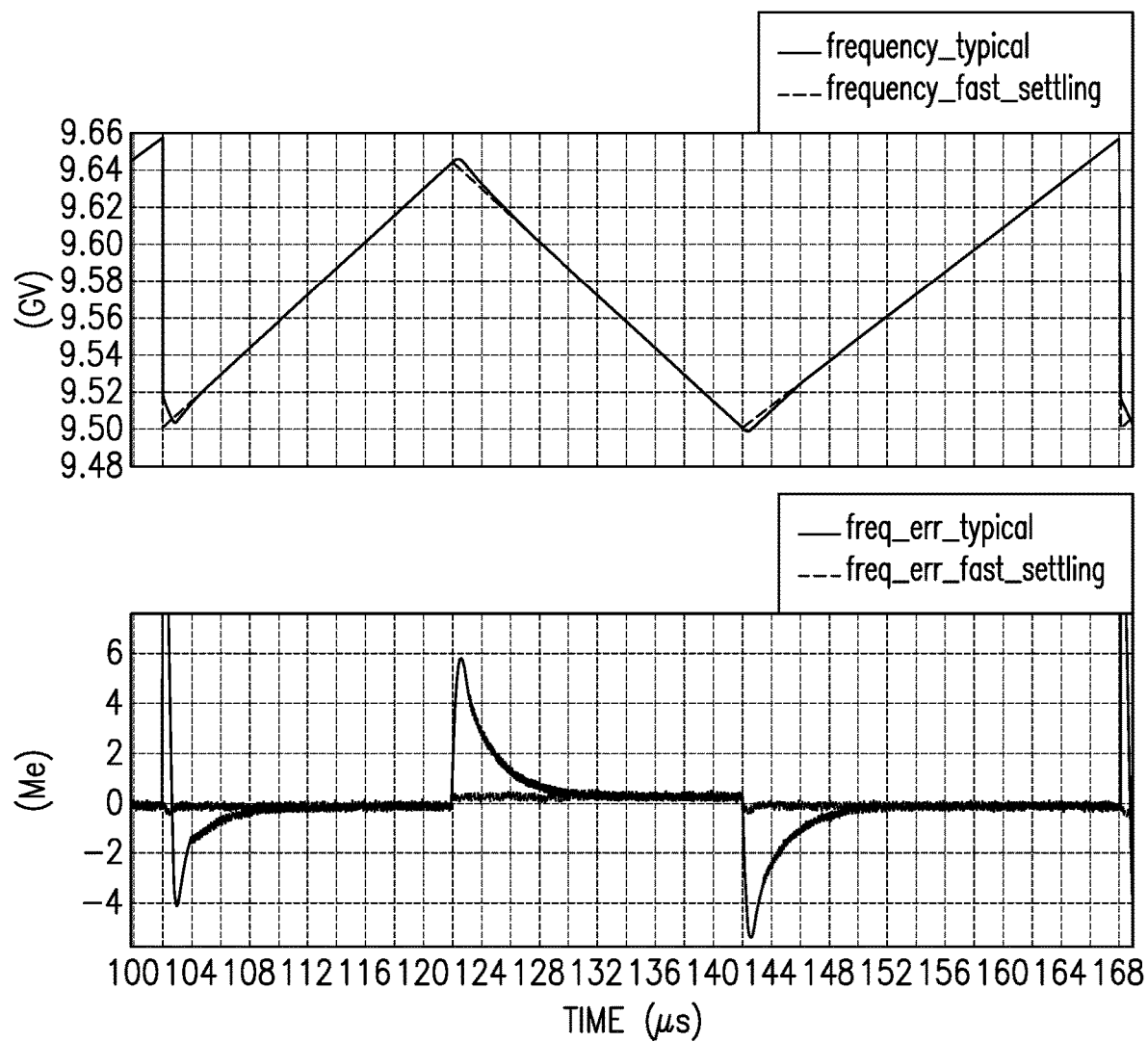
FIG. 4C compares a plot of a measured sawtooth ramp and frequency error for a DPLL that includes a DLF of FIG. 4A to a plot of a measured sawtooth ramp generated by a DPLL that includes a different DLF.

FIGS. 4B and 4C shows simulation plots of the internal nodes of a DPLL that includes a DLF 401 and a corresponding DPLL without the adjustment circuit 416. These simulation plots illustrate fast-settling ramp generation in a DPLL that includes the DLF 401. The simulation was setup to generate a triangular chirp followed by a sawtooth chirp. The output of the phase detector for (1) a DPLL with the DLF 401 (dashed line) and (2) a corresponding DPLL without the adjustment circuit 416 (solid line) are plotted in the first row of FIG. 4B. When configuration of without an adjustment circuit 416 is included in the DPLL, the loop can acquire the phase error $\Phi_{ramp}$ that maintains the ramp. This takes a finite time (e.g., about 10 μs in this simulation) to acquire this value. The input of the integrator of a DLF is shown in the second row of FIG. 4B, which follows the output of the phase detector in this case. With the configuration of FIG. 4A, the input at the integrator of the PI filter that can sustain the ramps is correctly estimated (see dashed line of second row in FIG. 4B) and added. This can ensure that the phase detector output does not deviate from its initial value of zero, which can result in a ramp generation engine with a relatively small settling time.

FIG. 4C shows the generated output frequency and the corresponding frequency error in this simulation for (1) a DPLL with the DLF 401 (dashed line) and (2) a corresponding DPLL without the adjustment circuit 416 (solid line). These plots indicate that the DLF 401 of FIG. 4A can cause settling time to decrease relative to other DLFs. For example, the plots indicate a decrease in settling time from about 10 μs to less than 1 μs.

Figure 5A:
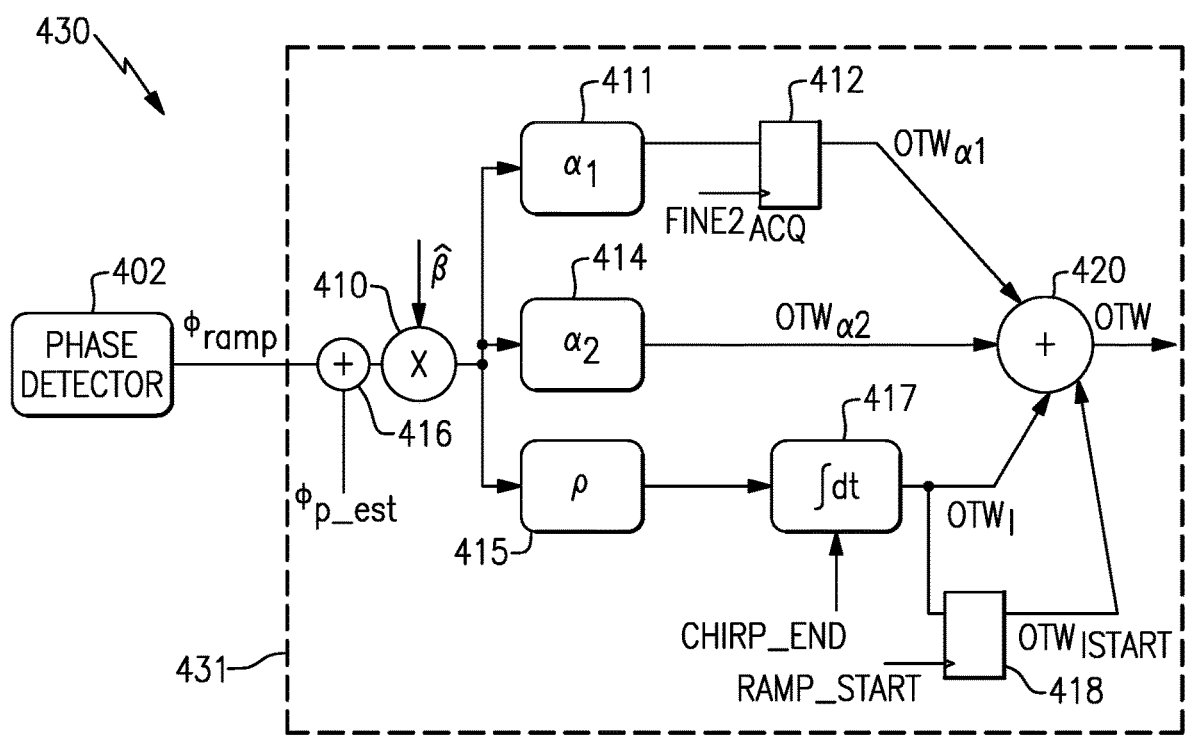
FIG. 5A shows a schematic block diagram of a portion of a DPLL that includes a DLF according to an embodiment.
Figure 5B:
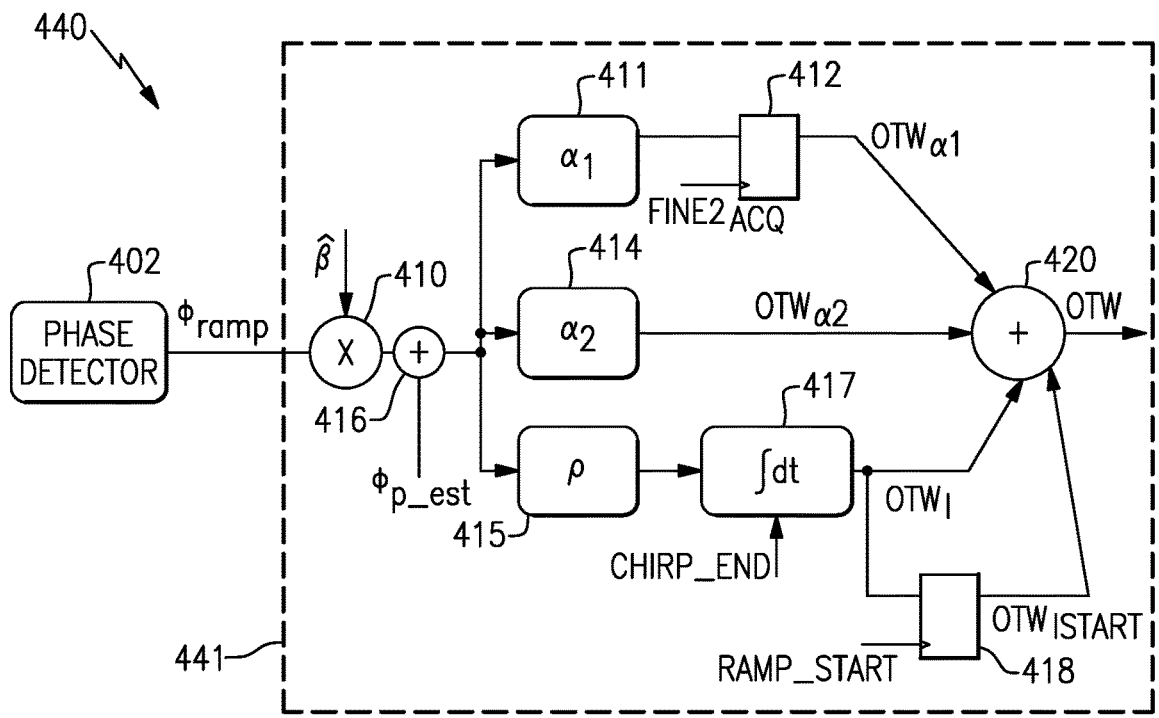
FIG. 5B shows a schematic block diagram of a portion of a DPLL that includes a DLF according to another embodiment.
Figure 5C:
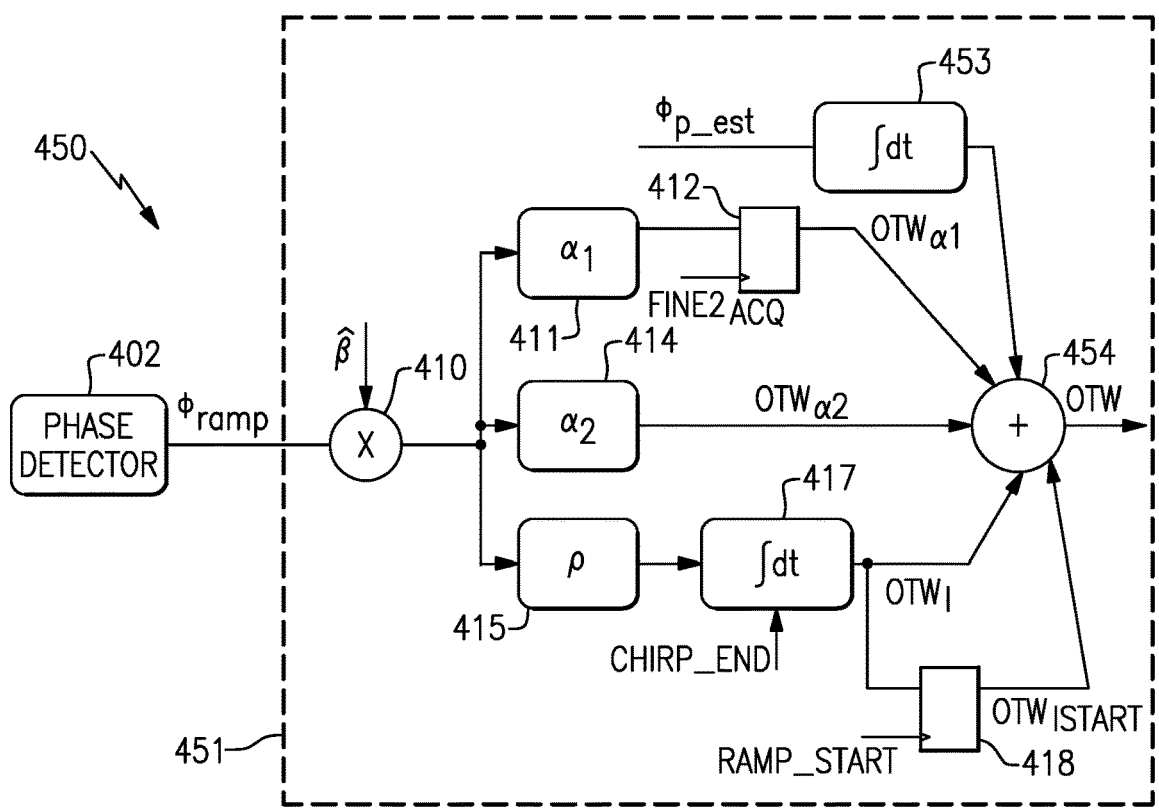
FIG. 5C shows a schematic block diagram of a portion of a DPLL that includes a DLF according to another embodiment.

The offset $\Phi_{p\_est}$ can be applied at various nodes between an output of a phase detector of a PLL and an input of an integrator of a loop filter of the PLL to cause settling time of a ramp signal to be reduced. FIGS. 5A, 5B, and 5C illustrate example loop filters arranged to generate fast settling ramps. Any suitable principles and advantages discussed herein can be applied to a loop filter of any FIGS. 5A, 5B, and/or 5C. Moreover, any suitable combination of features of FIGS. 4A, 5A, 5B, and/or 5C can be implemented together.

FIG. 5A shows a schematic block diagram of a portion 430 of a DPLL that includes a DLF 431 according to an embodiment. The DLF 431 is an example of the DLF 106 of FIG. 1. The DLF 431 is similar to the DLF 401 of FIG. 4A, except that the DLF 431 includes the adjustment circuit 416 between an output of the phase detector 402 and an input of the scaling circuit 410. The offset $\Phi_{p\_est}$ for the DLF 431 can be scaled relative to the offset $\Phi_{p\_est}$ in the DLF 401 of FIG. 4A.

For example, the offset $\Phi_{p\_est}$ for the DLF 401 can be scaled by the oscillator gain normalization factor β relative to the $\Phi_{p\_est}$ in the DLF 431. This can account for the output of the adjustment circuit 416 being scaled by the scaling circuit 410. The gains of first proportional block 411, the second proportional block 414, and the integral coefficient block 415 can be scaled in the DLF 431 relative to the DLF 401 to account for the offset $\Phi_{p\_est}$ being applied before scaling by the scaling circuit 410 in the DLF 431.

As another example, the offset $\Phi_{p\_est}$ for the DLF 401 can be scaled by the oscillator gain normalization factor β relative to the $\Phi_{p\_est}$ in the DLF 431 and by the integral coefficient ρ of the integral coefficient block 415. This can account for the output of the adjustment circuit 416 being scaled by the scaling circuit 410 and the integral coefficient block 415. The gains of first proportional block 411 and the second proportional block 414 can be scaled in the DLF 431 relative to the DLF 401 to account for the offset $\Phi_{p\_est}$ being applied before scaling by the scaling circuit 410 in the DLF 431.

FIG. 5B shows a schematic block diagram of a portion 440 of a DPLL that includes a DLF 441 according to an embodiment. The DLF 441 is another example of the DLF 106 of FIG. 1. The DLF 441 is similar to the DLF 431 of FIG. 5A, except that the DLF 441 includes the adjustment circuit 416 between an output of the scaling circuit 410 and the illustrated integral and proportional paths of the DLF 441. The offset $\Phi_{p\_est}$ for the DLF 441 can be scaled relative to the offset $\Phi_{p\_est}$ in the DLF 401 of FIG. 4A. For example, the offset $\Phi_{p\_est}$ for the DLF 401 can be scaled by the integral coefficient ρ of the integral coefficient block 415 relative to the $\Phi_{p\_est}$ in the DLF 431. In some instances, the integral coefficient ρ for the DLF 441 can be scaled relative to the integral coefficient ρ for the DLF 401. The gains of first proportional block 411 and the second proportional block 414 can be scaled in the DLF 441 relative to the DLF 401 to account for the offset $\Phi_{p\_est}$ being applied to an adjustment circuit 416 having an output provided to the first and second proportional paths of the DLF 411.

FIG. 5C shows a schematic block diagram of a portion 450 of a DPLL that includes a DLF 451 according to an embodiment. The DLF 451 is another example of the DLF 106 of FIG. 1. In the DLF 451, the offset $\Phi_{p\_est}$ can be applied via a dedicated integral path. The DLF 451 is similar to the DLF 401 of FIG. 4A, except that the DLF 451 includes a second integral path and the combining circuit 454 includes an additional input from the second integral path. As illustrated, the second integral path that includes a second integrator 453. The offset $\Phi_{p\_est}$ can be integrated by the second integrator 453. An output signal provided by the second integrator 453 can be provided to the combining circuit 454.

As discussed above, a predicted phase error can accurately be estimated when an indication of a gain kv of the oscillator of the DPLL is determined accurately over a frequency range of a chirp. This disclosure provides methods of determining an indicator of oscillator gain kv. Such methods include bow calibration and background calibration.

In the simulation plots of FIGS. 4B and 4C, an ideal oscillator gain was used in the model of the DCO and the estimated gain $\hat{k}_v$ is equal to the actual gain kv. This results in an accurate estimation of the $\Phi_{rampI}$ and, consequently, a small settling time. However, an error in the estimation of the oscillator gain should result in an increased settling time. The oscillator gain kv (or any other indicator of oscillator gain kv, such as a normalization factor β) can be estimated by measuring the change in fine code for a controlled change in the FCW. Alternatively, the oscillator gain kv can be estimated by measuring the change in FCW for a controlled change in fine code by re-configuring the loop for frequency measurement, for example, as described in U.S. patent application Ser. No. 15/284,374 filed Oct. 3, 2016, the disclosure of which is hereby incorporated by reference in its entirety herein. A one-time calibration can be run at the start of every burst of chirps to measure the gain at the start and end frequencies of the chirp to be generated. The gain normalization factor β for the intermediate frequencies can be derived, for example, by linearly interpolating between these values. In this analysis, β is assumed to vary linearly with the frequency of the generated ramp.

Figure 6:
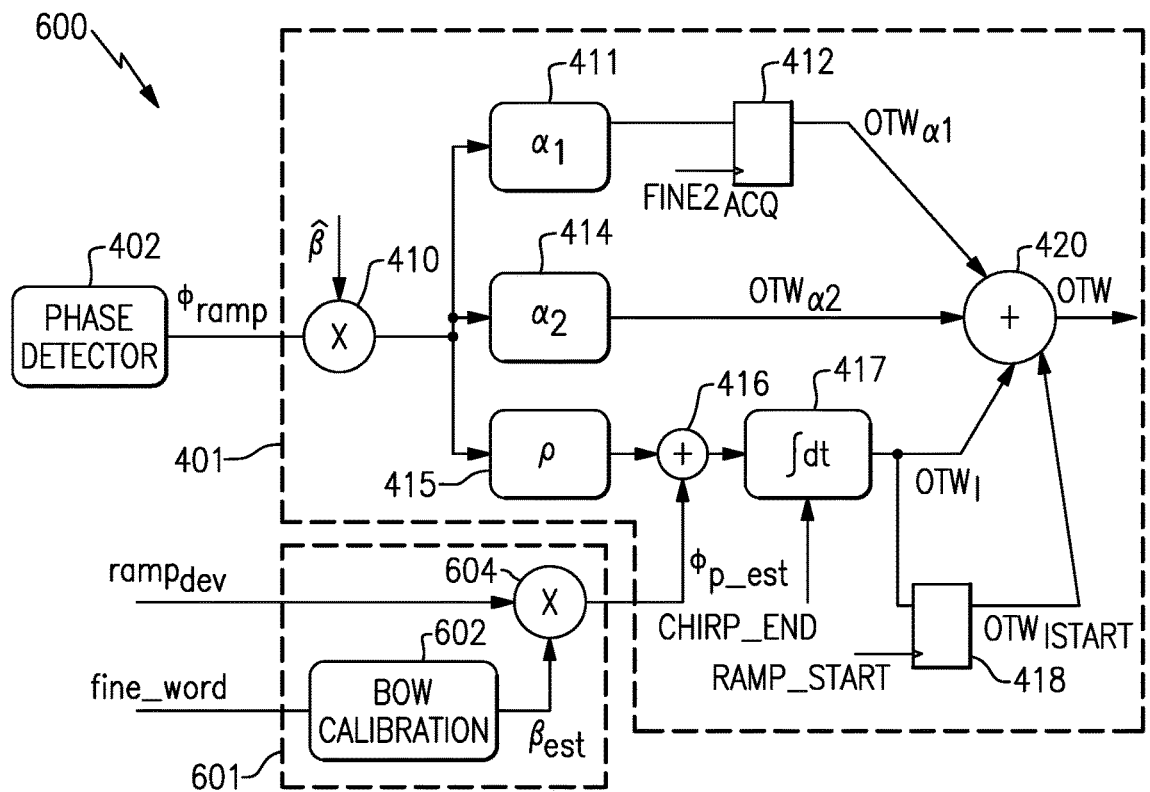
FIG. 6 illustrates a schematic block diagram of a portion of a DPLL that includes a loop filter and an oscillator gain estimation circuit according to an embodiment.

FIG. 6 illustrates a schematic block diagram of a portion 600 of a DPLL that includes a loop filter 401 and phase error circuit 601 according to an embodiment. The illustrated phase error circuit 601 includes an oscillator gain estimation circuit 602 and a scaling circuit 604. The oscillator gain estimation circuit 602 can generate the estimated gain normalization term βest for a given fine code. The oscillator gain estimation circuit 602 is a bow calibration circuit as illustrated. The oscillator gain estimation circuit 602 can store the values of the normalization factor β at either ends of the generated frequency ramp and the corresponding oscillator tuning words for start and end frequency of the ramp from the one-time calibration. During ramp generation, oscillator gain estimation circuit 602 can read the current value of the oscillator tuning word and generate a corresponding value for the gain normalization factor β. This can generate an accurate estimate of the gain normalization factor β. The scaling circuit 604 can multiply the gain normalization factor β by the ramp deviation $ramp_{DEV}$ to generate the estimate of the phase error at the input of the integrator 416, for example, according to Equation 9.

A calibration routine to generate gain normalization term β for a fixed ΔFCW will now be discussed. The calibration routine can be performed using the oscillator gain estimation circuit 602. The calibration routine can measure the normalization factor $\hat{\beta}$ (see Equation 4) at any suitable output frequency fout as outlined below. The calibration routine outlined below can be performed once before generating ramp signals. Oscillator gain kv can change with temperature. Accordingly, in some instances, the routine outlined below can be performed to update the estimated gain to reflect changes in temperatures. For instance, the routine could be implemented between chirps.

The PLL can be locked to a frequency fout1 by setting the corresponding FCW1 and the fine code fine1 that generates this frequency can be stored after the PLL is locked. Equation 11 shows that the frequency fout1 can be a product of the fine code fine1 and the oscillator gain kv.

$$f_{out1}=(FCW_1 * f_{REF})=\text{fine}_1 * k_V \quad \text{Equation 11}$$

The FCW can then be increased by a relatively small value (e.g., 0.5 LSB) and the PLL is locked to this frequency. The new fine code fine2 can be stored after the PLL is locked. Equation 12 shows that the frequency fout2 can be a product of the fine code fine2 and the oscillator gain kv.

$$f_{out2}=((FCW_1+0.5) * f_{REF})=\text{fine}_2 * k_V \quad \text{Equation 12}$$

By subtracting the terms from Equation 11 from the terms from Equation 12, Equation 13 and/or Equation 14 can be derived.

$$(0.5 * f_{REF}) = (fine_2 - fine_1) * k_V \quad \text{Equation 13}$$

$$\beta = \frac{f_{REF}}{k_v} 2 * (fine_2 - fine_1) \quad \text{Equation 14}$$

The oscillator gain normalization factor β can therefore be estimated at the either ends of the generated frequency ramp. These normalization factors can be denoted βtop and βbottom. The average βav can be obtained from Equation 15.

$$\beta_{av} = \left( \frac{fine_{top} - fine_{bottom}}{FCW_{top} - FCW_{bottom}} \right) \quad \text{Equation 15}$$

Once the normalization factor at the either ends of the frequency of the generated ramp is known, the estimated β term corresponding to each fine code can be represented by Equation 16.

$$\beta_{est}(\text{fine}) = \quad \text{Equation 16}$$
$$\beta_{bottom} + \left( \frac{(\beta_{top} - \beta_{bottom})}{(fine_{top} - fine_{bottom})} \right) * (\text{fine} - fine_{bottom})$$

The one-time calibration can measure and store the inputs βtop, βbottom, $\text{fine}_{TOP}$, $\text{fine}_{BOTTOM}$, and βav. Once these values are known, the correction term can be calculated for normal operation of the PLL, for example, using Equation 16.

Figure 7A:
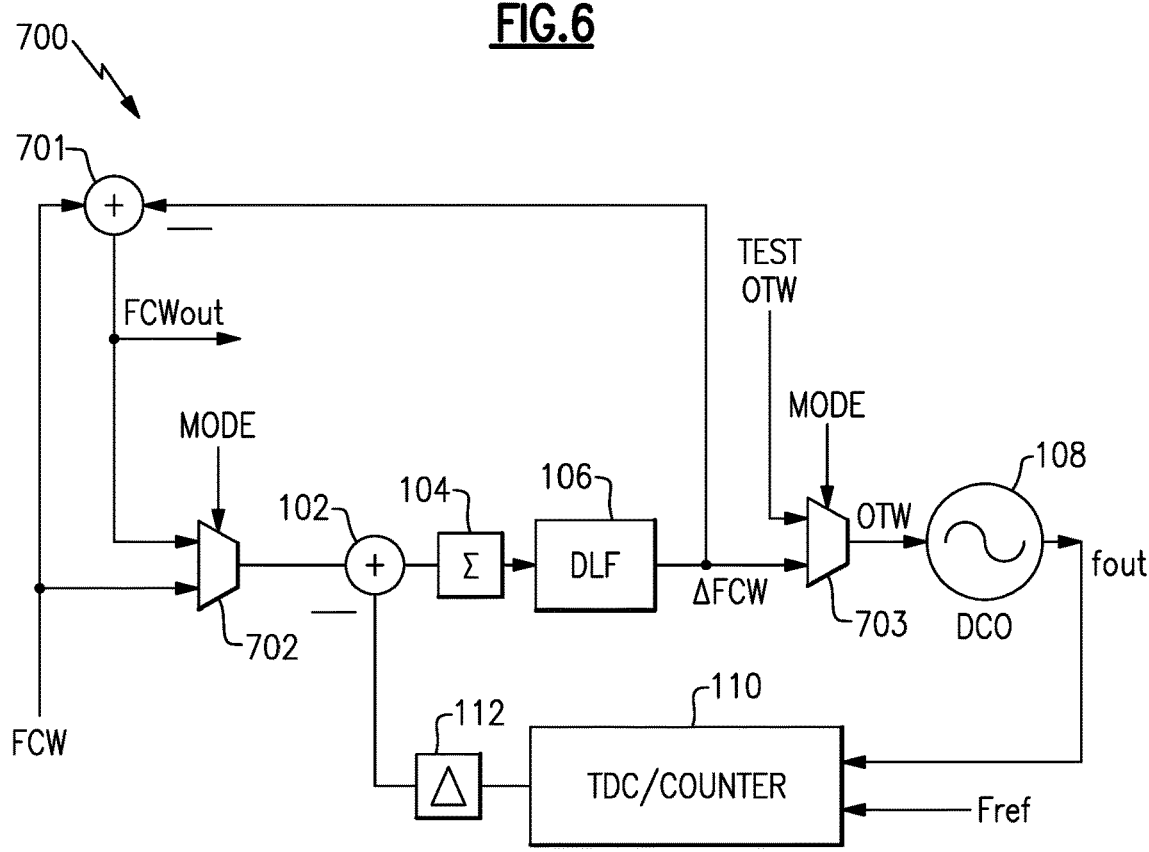
FIG. 7A illustrates a schematic block diagram of a re-configurable DPLL according to an embodiment.
Figure 7B:
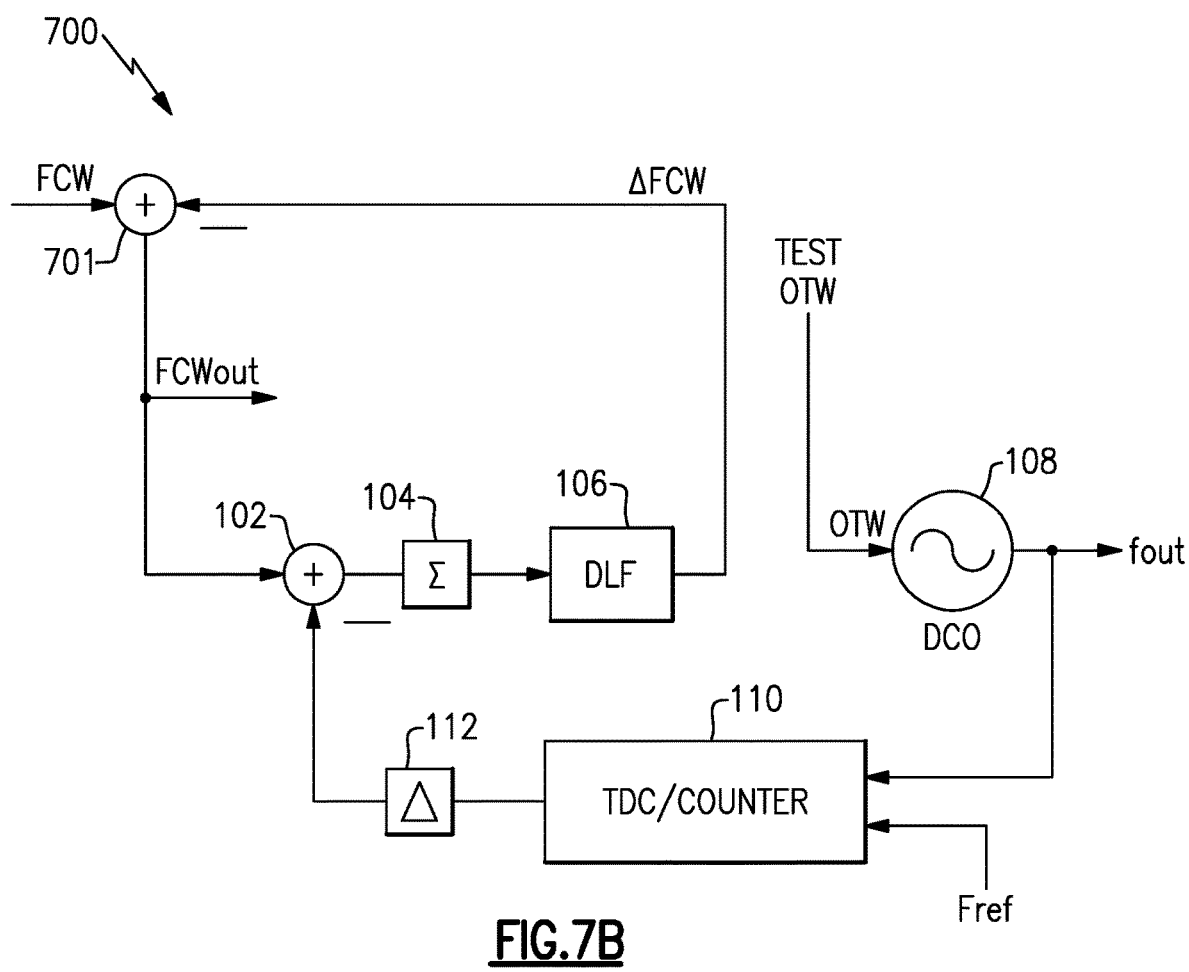
FIG. 7B illustrates a schematic block diagram of a functional equivalent of the DPLL of FIG. 7A in a test mode.

A calibration routine to generate gain normalization term β for a fixed Δfine will now be discussed. In this calibration routine, a DPLL can be re-configured to measure a frequency command word FCW from a fixed oscillator tuning word OTW input. FIGS. 7A and 7B, which are discussed below, illustrate a re-configurable DPLL 700 can be used in such a calibration routine. A calibration routine to measure the normalization factor $\hat{\beta}$ at any output frequency fout is outlined below.

The PLL can be locked to the frequency fout1 by setting the corresponding $FCW_1$ and the fine code that generates this frequency $\text{fine}_1$ is stored after the PLL is locked. The output frequency fout1 can be represented by Equation 17.

$$f_{out_1} = (FCW_1 * f_{REF}) = \text{fine}_1 * k_v \qquad \text{Equation 17}$$

The fine code can increased by a relatively small value, such as by 4 codes, and the re-configured PLL is locked to obtain the change in FCW. This change in FCW is stored after the PLL is locked in re-configured mode. Equation 18 represents such a change.

$$f_{out_2} = ((FCW_1 + \Delta FCW) * f_{REF}) = (\text{fine}_1 + 4) * k_v \qquad \text{Equation 18}$$

Subtracting Equation 17 from Equation 18 results in Equation 19 or Equation 20.

$$(\Delta FCW * f_{REF}) = 4k_v \qquad \text{Equation 19}$$

$$\beta = \frac{f_{REF}}{k_v} = \frac{4}{\Delta FCW} \qquad \text{Equation 20}$$

The oscillator gain normalization factor β can therefore be estimated at the either ends of a generated frequency ramp—βtop and βbottom. Once these values are known, a correction term can be calculated, for example, using Equation 16.

FIG. 7A illustrates a schematic block diagram of a re-configurable DPLL 700. FIG. 7B illustrates a schematic block diagram of a functional equivalent of the DPLL 700 in a test mode. The DPLL 700 includes a summer 102, an accumulator 104, a DLF 106, a DCO 108, and TDC/counter 110, and a differentiation block 112. The DPLL 700 also includes a combining circuit 701, a first multiplexer 702, and a second multiplexer 703 to enable the DPLL 700 to be re-configured. The DPLL 700 can function in at least a normal mode and a test mode. In the normal mode, the DPLL 700 can operate like the DPLL 100 of FIG. 1. A mode select signal MODE can be provided to the first multiplexer 702 and the second multiplexer 703. The mode signal MODE toggling can cause the DPLL 700 to toggle between normal mode and test mode.

In the test mode, the DPLL 700 can function as shown in FIG. 7B. The DPLL 700 can receive a test OTW, which can be provided as the OTW to the DCO 108 in the test mode. The DCO 108 outputs the output signal fout based on the test OTW in the test mode. The oscillating output signal is provided to the TDC/counter 307, which is not part of a closed feedback loop to the oscillator 108 in the test mode. The summer 102 subtracts the output of the differentiation block 112 from an indication of output frequency $FCW_{OUT}$. The indication of output frequency $FCW_{OUT}$ is provided to the summer 102 in the test mode, thereby generating the error signal for the test mode. The error signal is provided to the DLF 106, which outputs a ΔFCW. The ΔFCW can be changed in sign and added to (or subtracted from) an FCW using the combining circuit 701 to generate the indication of output frequency $FCW_{OUT}$.

Methods of computing oscillator gain described above can involve computing an indicator of oscillator gain before generating a ramp signal. Other methods of computing oscillator gain can involve computing an indicator of oscillator gain while a PLL is generating a ramp signal. A method of computing oscillator gain that can run in a background is described below.

For the system shown in FIG. 4A, any inaccuracy in the estimated value of the oscillator gain normalization factor β can be compensated by the DPLL resulting in the phase error $\Phi_{ramp}$ to deviate from zero. This indicates that phase detector output provides a measure of the inaccuracy in the estimated oscillator gain and hence can be used to correct the estimated oscillator gain. When the estimated gain normalization factor $\hat{\beta}$ is underestimated, the phase error and the ramp slope A should have same sign. This information can be used to generate the correction term for the estimated gain normalization factor $\hat{\beta}$. Similar information case be used to generate the correction term for when the oscillator gain normalization factor $\hat{\beta}$ is overestimated. A correction loop that implements adjustment to an estimate of an indicator of oscillator gain can be run in the background and may not interfere with the normal operation of the PLL. Once the estimated indication of oscillator gain (e.g., normalization factor) approaches the actual value, the estimation of the phase error $\Phi_{ramp}$ should be accurate. This should result in a small settling time. Since the error should be independent of the ramp profile, once the correct oscillator gain is estimated, the settling time should remain small for subsequent chirps, even when the ramp profile changes.

Figure 8:
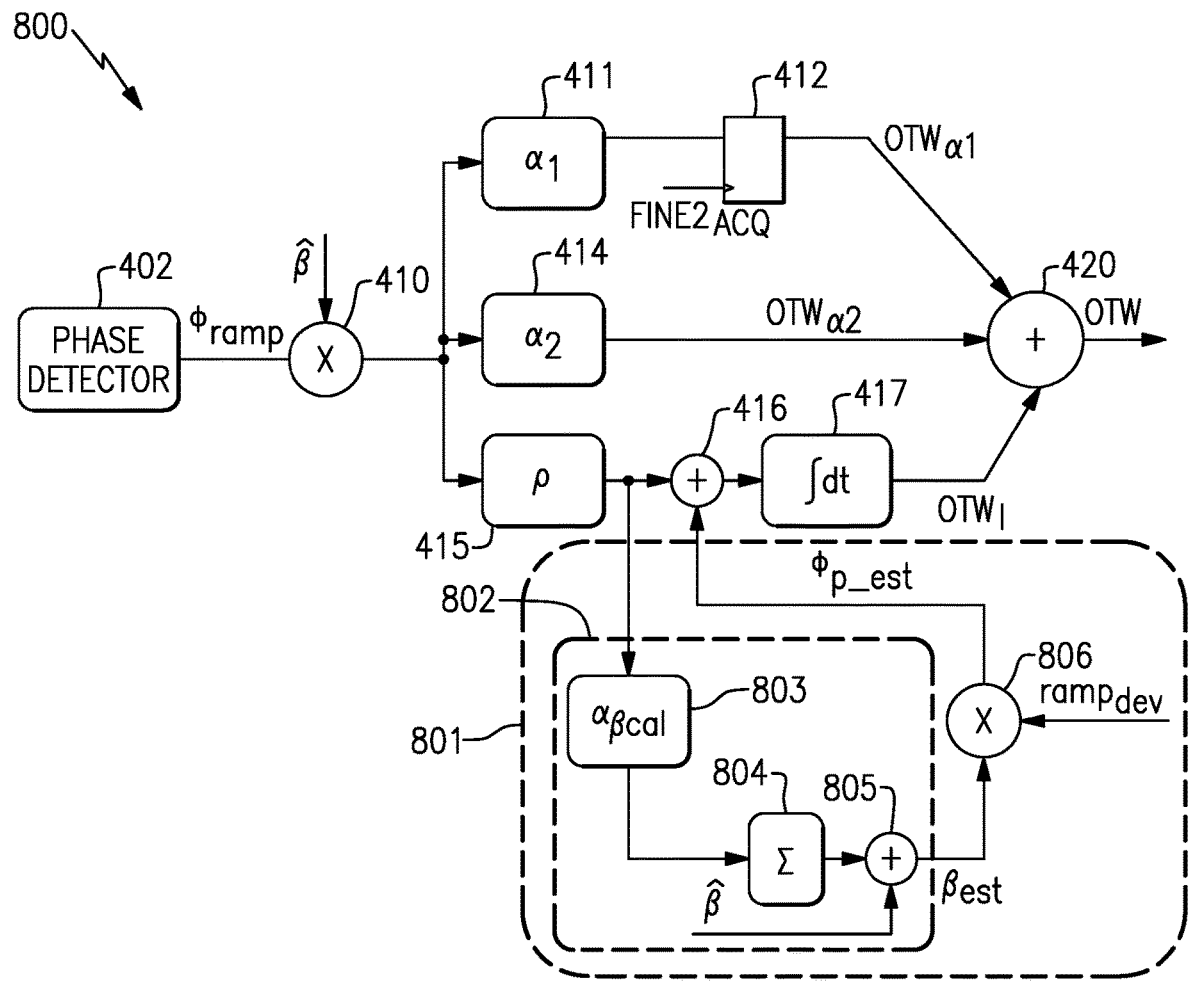
FIG. 8 is a schematic block diagram of a portion of a DPLL that includes a phase error circuit according to an embodiment.

FIG. 8 is a schematic block diagram of a portion 800 of a DPLL that includes a phase error circuit 801 according to an embodiment. The illustrated phase error circuit 801 includes an oscillator gain estimation circuit 802 that can receive an output signal of the proportional part of the PI filter of the DLF. The illustrated oscillator gain estimation circuit includes a proportional block 803, an integrator 804, and an adjustment circuit 805. The proportional block 803 can multiply the output signal of the proportional part of the PI filter by a programmable gain constant $\alpha_{\beta cal}$. The output signal from the proportional block 803 can be integrated by the integrator 804 to generate a correction term for the indicator of oscillator gain. The adjustment circuit 805 can use this correction term to adjust the estimate of oscillator gain. For example, the adjustment circuit can add the correction term to the estimate of oscillator gain. The adjustment circuit 805 can provide an updated estimate of oscillator gain βest. A scaling circuit 806 of the phase error circuit can multiply the output signal of the updated estimate of oscillator gain βest by the ramp deviation rampdev to generate the estimate of the phase error at the input of the integrator 417. This can provide phase error signal $\Phi_{p\_est}$ based on Equation 9.

Although the phase error circuit 801 is illustrated with the DLF similar to the DLF 401 of FIG. 4A, a phase error circuit in accordance with any of the principles and advantages discussed with reference to FIG. 8 can be implemented in association with any other suitable DLF. For instance, a DLF with the features of the DLF 401 not illustrated in FIG. 8 can be implemented with the phase error circuit 801. As another example, a DLF in accordance with any suitable principles and advantages of FIGS. 5A to 5C can be implemented with the phase error circuit 801 and/or a similar phase error circuit.

While the phase error circuit 801 is shown as receiving the output signal from block 415 in FIG. 8, a phase error circuit could alternatively or additionally receive a different signal from the DLF. For instance, a phase error circuit could receive an output signal from the phase detector 402 such a phase error circuit could scale this output signal accordingly and/or adjust the programmable gain constant $\alpha_{\beta cal}$ relative to the circuit shown in FIG. 8. As another example, a phase error circuit could receive an output signal from the scaling circuit 410 such a phase error circuit could scale this output signal accordingly and/or adjust programmable gain constant $\alpha_{\beta cal}$ relative to the circuit shown in FIG. 8.

Figure 9:
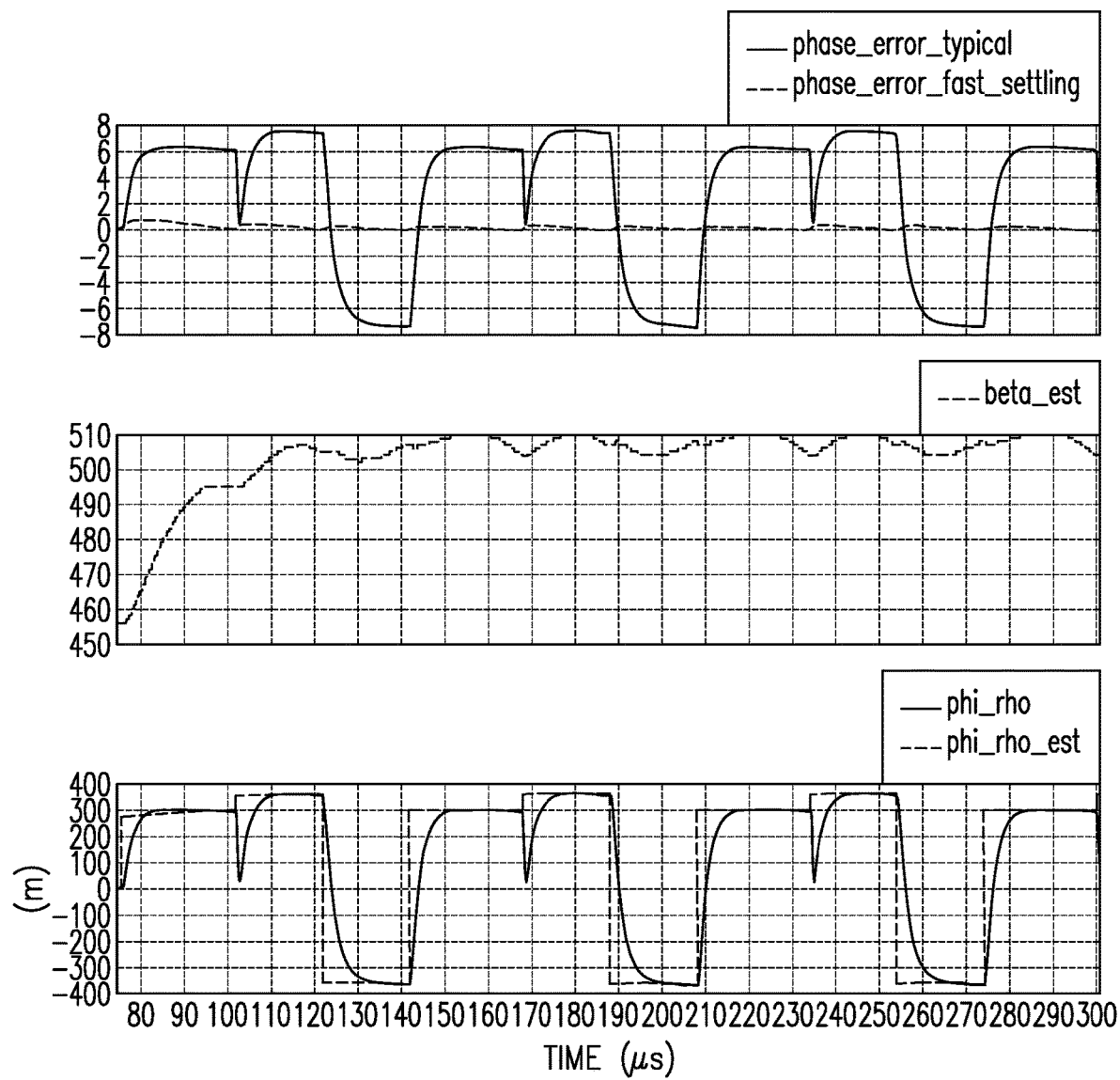
FIG. 9 illustrates simulated plots of the phase error and a proportional-integral (PI) filter integrator input for a DPLL with and without implementing features of this disclosure.

FIG. 9 illustrates simulated plots of the phase error and the PI filter integrator input for a DPLL with and without features of the DLFs disclosed herein using measured oscillator gain kv and closed loop calibration for oscillator gain normalization factor β estimation. FIG. 9 indicates that estimation of the $D\Phi_{rampI}$ is inaccurate at the start. As the estimated oscillator gain normalization factor βest approaches an accurate value, the estimation of $\Phi_{rampI}$ also approaches an accurate value and hence the settling time improves.

Figure 10:
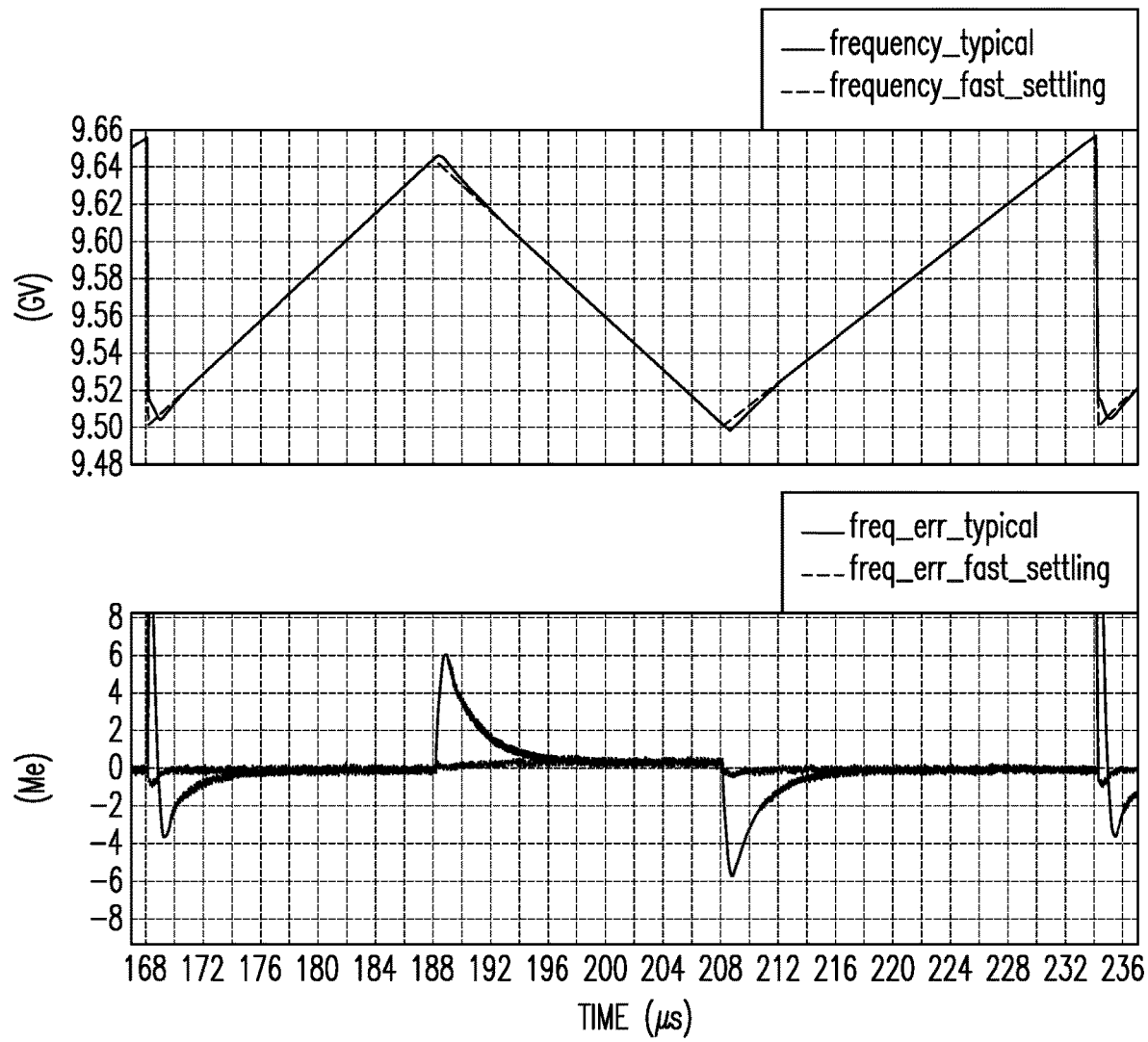
FIG. 10 illustrates simulated plots of the frequency and the frequency error with and without implementing features of this disclosure.

FIG. 10 illustrates simulated plots of the frequency and the frequency error with and without fast settling improvements using measured oscillator gain kv and closed loop calibration for oscillator gain normalization factor β estimation. FIG. 10 shows that the settling time is small and is similar to that achieved when ideal oscillator gain is used as depicted in FIG. 4C.

Methods, circuits, and systems to significantly reduce the settling time of a ramp generated by a PLL are disclosed. Improvements to the settling time disclosed herein can apply to any suitable ramp profiles, including triangular ramps, sawtooth ramps, and ramps having two or more slopes. Such improvements can be implemented with wideband ramps. A fast settling time can be achieved by estimating a phase error to sustain a ramp and adding the estimated phase error as an offset in a PLL, thereby relieving the loop from acquiring the phase error to sustain the ramp. Since estimation of phase error can be a function of oscillator gain, routines to accurately estimate oscillator gain are described. Such routines include a one-time bow calibration routine and a closed-loop background calibration loop to accurately estimate the oscillator gain. Simulated and measured results of the generated sawtooth ramps are provided, which show that the settling time can improves from s to less than 2 s for all cases.

Any of the principles and advantages discussed herein can be applied to other systems, circuits, and methods, not just to the systems, circuits, and methods described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Some of the embodiments described above have provided examples in connection with DPLLs. However, any suitable principles and advantages of the embodiments can be applied to charge pump PLLs as appropriate. More generally, any of the principles and advantages discussed herein can be implemented in connection with any other systems, apparatus, or methods that benefit could from any of the teachings herein. For instance, any of the principles and advantages discussed herein can be implemented in connection with any devices with a need for a reduced settling time of a ramp signal.

Aspects of this disclosure can be implemented in various electronic devices. For instance, one or more DPLLs implemented in accordance with any of the principles and advantages discussed herein can be included in various electronic devices. Examples of the electronic devices can include, but are not limited to, radar systems, radar detectors, consumer electronic products, parts of the consumer electronic products such as semiconductor die and/or packaged modules, electronic test equipment, wireless communication devices, medical devices and/or medical systems, industrial electronics systems, a vehicular electronics system such as an automotive electronics system, etc. Examples of the electronic devices can also include communication networks. The consumer electronic products can include, but are not limited to, a phone such as a smart phone, a laptop computer, a tablet computer, a wearable computing device such as a smart watch or an ear piece, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A phase-locked loop with fast settling ramp generation, the phase-locked loop comprising:
   a phase detector comprising an output; and
   a loop filter comprising an integrator and an input coupled to the output of the phase detector, the loop filter configured to provide a ramp signal;
   wherein the phase-locked loop is configured to apply an offset signal indicative of a predicted phase error to adjust an input signal provided to the integrator to cause settling time of the ramp signal to be reduced.

2. The phase-locked loop of claim 1, wherein the phase-locked loop is configured to apply the offset signal between the output of the phase detector and an input of the integrator.

3. The phase-locked loop of claim 1, further comprising:
an oscillator comprising an input coupled to an output of the loop filter; and
a phase error circuit configured to compute the offset signal based on (i) a change in slope of the ramp signal and (ii) an indication of gain of the oscillator.

4. The phase-locked loop of claim 3, further comprising an oscillator gain estimation circuit configured to provide the indication of gain of the oscillator to the phase error circuit.

5. The phase-locked loop of claim 4, wherein the oscillator gain estimation circuit comprises a correction loop configured to generate the indication of gain of the oscillator based on an output signal at the output of the phase detector.

6. The phase-locked loop of claim 4, wherein the oscillator gain estimation circuit is configured to compute the indication of gain of the oscillator based on measurements of a parameter of the phase-locked loop changing in response to changing a signal applied to the phase-locked loop.

7. The phase-locked loop of claim 1, further comprising an adjustment circuit comprising an input configured to receive the offset signal and an output electrically connected to the integrator.

8. The phase-locked loop of claim 1, wherein the phase-locked loop is a type II phase-locked loop.

9. The phase-locked loop of claim 1, further comprising:
a digitally controlled oscillator, wherein the ramp signal represents an oscillator tuning word for the digitally controlled oscillator; and
a time-to-digital converter coupled in a feedback path between an output of the digitally controlled oscillator and an input of the phase detector.

10. The phase-locked loop of claim 1, wherein the settling time of the ramp signal is less than 1 microsecond.

11. The phase-locked loop of claim 1, wherein the offset signal has a value to cause an output signal of the phase detector provided to the loop filter to remain at approximately zero while the loop filter generates the ramp signal.

12. A method of generating a ramp signal with a fast settling time in a phase-locked loop, the method comprising:
applying an offset signal to adjust an input signal provided to an integrator of a loop filter of the phase-locked loop; and
generating the ramp signal at an output of the loop filter of a phase-locked loop, wherein the applying the offset signal indicative of a predicted phase error causes settling time of the ramp signal to be reduced.

13. The method of claim 12, further comprising:
computing an indication of gain of an oscillator of the phase-locked loop; and
generating the offset signal based on the indication of gain of the oscillator of the phase-locked loop.

14. The method of claim 12, further comprising generating an oscillating signal with a digitally controlled oscillator of the phase-locked loop, wherein the ramp signal represents an oscillator tuning word for the digitally controlled oscillator.

15. The method of claim 14, further comprising providing feedback from the digitally controlled oscillator to the phase detector by way of feedback path that comprises a time-to-digital converter.

16. The method of claim 14, wherein the ramp signal has at least two different slopes.

17. A phase-locked loop with fast settling ramp generation, the phase-locked loop comprising:
an input configured to receive a frequency command word that ramps in time;
a phase detector coupled to the input of the phase-locked loop, the phase detector comprising an output configured to provide an output signal representing a phase error, wherein the output signal is based on the frequency command word;
a loop filter comprising:
an input coupled to the output of the phase detector;
a first proportional path;
a second proportional path different from the first proportional path; and
an integral path,
the loop filter configured to generate a ramp signal such that the ramp signal has a settling time of less than 2 microseconds, wherein the ramp signal has at least two different slopes; and
an oscillator coupled to the loop filter, the oscillator configured to generate an oscillating signal based on the ramp signal.

18. The phase-locked loop of claim 17, wherein the loop filter comprises an integrator, and the phase-locked loop is configured to apply an offset signal to adjust an input signal provided to the integrator to cause settling time of the ramp signal to be reduced.

19. The phase-locked loop of claim 17, further comprising a time-to-digital converter coupled in a feedback path between an output of the oscillator and an input of the phase detector.

20. The phase-locked loop of claim 17, wherein the phase-locked loop is configured such that the output signal of the phase detector provided to the loop filter remains at approximately zero while the loop filter generates the ramp signal.

* * * * *